United States Patent
Dutta et al.

(10) Patent No.: US 11,437,083 B2
(45) Date of Patent: Sep. 6, 2022

(54) TWO-BIT MAGNETORESISTIVE RANDOM-ACCESS MEMORY DEVICE ARCHITECTURE

(71) Applicant: International Business Machines Corporation, Armonk, NY (US)

(72) Inventors: Ashim Dutta, Menands, NY (US); Eric Raymond Evarts, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/168,891

(22) Filed: Feb. 5, 2021

(65) Prior Publication Data

US 2022/0254396 A1 Aug. 11, 2022

(51) Int. Cl.
*G11C 11/16* (2006.01)
*H01L 27/22* (2006.01)
*H01L 43/12* (2006.01)
*H01L 43/02* (2006.01)

(52) U.S. Cl.
CPC ........ *G11C 11/1659* (2013.01); *G11C 11/161* (2013.01); *G11C 11/1673* (2013.01); *G11C 11/1675* (2013.01); *H01L 27/224* (2013.01); *H01L 27/228* (2013.01); *H01L 43/02* (2013.01); *H01L 43/12* (2013.01)

(58) Field of Classification Search
None
See application file for complete search history.

(56) References Cited

U.S. PATENT DOCUMENTS

| 5,764,588 | A | * | 6/1998 | Nogami | G11C 8/16 365/72 |
|---|---|---|---|---|---|
| 6,879,508 | B2 | | 4/2005 | Tran | |
| 7,336,528 | B2 | | 2/2008 | Lim | |
| 7,436,698 | B2 | | 10/2008 | Lin et al. | |
| 7,539,047 | B2 | | 5/2009 | Katti | |
| 7,872,904 | B2 | | 1/2011 | Wang et al. | |
| 8,432,727 | B2 | | 4/2013 | Ryu et al. | |
| 8,611,145 | B2 | | 12/2013 | Zhou et al. | |
| 8,654,577 | B2 | | 2/2014 | Fang et al. | |

(Continued)

OTHER PUBLICATIONS

International Search Report and Written Opinion, International Application No. PCT/EP2022/051028, dated Apr. 21, 2022, 13 pgs.

*Primary Examiner* — Tan T. Nguyen
(74) *Attorney, Agent, or Firm* — Kelli D. Morin

(57) ABSTRACT

A magnetoresistive random-access memory (MRAM) device includes a first cell selectively connected to a first bit line and a second cell selectively connected to a second bit line. The MRAM device further includes a shared transistor connected to the first cell and connected to the second cell. The MRAM device further includes a first selector device and a second selector device. The first selector device is configured to permit current to flow through the first cell to the shared transistor when a voltage applied to the first selector device is larger than a threshold activation voltage. The second selector device is configured to permit current to flow through the second cell to the shared transistor when a voltage applied to the second selector device is larger than a threshold activation voltage. The MRAM cell further includes a word line connected to a gate of the shared transistor.

25 Claims, 17 Drawing Sheets

(56) References Cited

U.S. PATENT DOCUMENTS

| | | | |
|---|---|---|---|
| 8,953,380 B1 * | 2/2015 | Yu | G11C 16/10 |
| | | | 365/185.28 |
| 9,196,340 B2 | 11/2015 | Kim et al. | |
| 9,715,916 B1 * | 7/2017 | Tomishima | G11C 11/1673 |
| 9,734,884 B2 | 8/2017 | Mam et al. | |
| 9,799,384 B2 | 10/2017 | Stainer | |
| 10,224,368 B2 | 3/2019 | Li et al. | |
| 10,665,281 B1 | 5/2020 | Jacob et al. | |
| 2005/0167657 A1 | 8/2005 | Nickel et al. | |
| 2015/0213867 A1 | 7/2015 | Wu et al. | |
| 2015/0263069 A1 | 9/2015 | Jo | |
| 2020/0098409 A1 | 3/2020 | Li et al. | |

* cited by examiner

500

```
┌─────────────────────────────────────────┐
│ Receive a command to store a value in a │
│ first bit or determine a value stored   │
│ in the first bit                        │
│                  504                    │
└─────────────────────────────────────────┘
                    │
                    ▼
┌─────────────────────────────────────────┐
│ Determine that the value is stored or   │
│ is to be stored in a particular MTJ     │
│                  508                    │
└─────────────────────────────────────────┘
                    │
                    ▼
┌─────────────────────────────────────────┐
│ Selectively activate transistors to     │
│ cause current to flow through           │
│ particular MTJ                          │
│                  512                    │
└─────────────────────────────────────────┘
```

FIG. 5

TWO-BIT MAGNETORESISTIVE RANDOM-ACCESS MEMORY DEVICE ARCHITECTURE

BACKGROUND

The present disclosure relates to the electrical, electronic, and computer fields. In particular, the present disclosure relates to two-bit magnetoresistive random-access memory (MRAM) cells having three transistors and methods of manufacturing the same.

MRAM is a type of non-volatile memory used in computers and other electronic devices to store data. Unlike conventional read-access memory (e.g., dynamic read-access memory (DRAM)), which stores data as electric charge or current flows (e.g., using capacitors), MRAM stores the data in magnetic domains using magnetic storage elements. The magnetic storage elements are formed from two ferromagnetic plates, each of which can hold a magnetization, separated by an insulating layer. One of the two plates is a permanent magnet set to a particular polarity; the other plate's magnetization can be changed to match that of an external field to store memory. This configuration is known as a magnetic tunnel junction and is one example structure for an MRAM cell. A memory device is built from an array of such "cells".

SUMMARY

Embodiments of the present disclosure include a magnetoresistive random-access memory (MRAM) device. The MRAM device comprises a first cell selectively connected to a first bit line and a second cell selectively connected to a second bit line. The MRAM device further includes a shared transistor connected to the first cell and connected to the second cell. The MRAM device further includes a first selector device and a second selector device. The first selector device corresponds to the first cell and is configured to permit current to flow through the first cell to the shared transistor when a voltage applied to the first selector device is larger than a threshold activation voltage. The second selector device corresponds to the second cell and is configured to permit current to flow through the second cell to the shared transistor when a voltage applied to the second selector device is larger than the threshold activation voltage. The MRAM device further includes a word line connected to a gate of the shared transistor.

Additional embodiments of the present disclosure include a method of forming a two-bit MRAM device. The method includes forming a first bottom electrode and a second bottom electrode on a common landing pad. The method further includes forming a first cell connected to the first bottom electrode, wherein forming the first cell includes forming a first top electrode and a first selector device such that the first selector device is arranged between the first top electrode and the common landing pad. The method further includes forming a second cell connected to the second bottom electrode, wherein forming the second cell includes forming a second top electrode and a second selector device such that the second selector device is arranged between the second top electrode and the common landing pad.

Additional embodiments of the present disclosure include a method of programming a two-bit MRAM device. The method includes receiving a write command to program a first bit in a two-bit MRAM device. The two-bit MRAM device comprises a first cell including a first magnetic tunnel junction (MTJ) and a first electrode, a second cell including a second MTJ and a second electrode, a first transistor connected to the first cell and to a first bit line, a second transistor connected to the second cell and to a second bit line, a shared transistor connecting the first cell and the second cell to a source line, a first selector device arranged between the shared transistor and the first electrode, and a second selector device arranged between the shared transistor and the second electrode. The method further includes determining that the first bit is to be stored in a particular MTJ, wherein the particular MTJ is one of the first MTJ and the second MTJ. The method further includes selectively activating the shared transistor and one of the first transistor and the second transistor to cause current to flow through the particular MTJ, wherein selectively activating the shared transistor and the one of the first transistor and the second transistor causes current to flow through the first selector device when the particular MTJ is the first MTJ and through the second selector device when the particular MTJ is the second MTJ.

Additional embodiments of the present disclosure include a method of determining a value stored in a two-bit MRAM device. The method includes receiving a read command to determine a value stored in a first bit in a two-bit MRAM device. The two-bit MRAM device includes a first cell including a first MTJ and a first electrode, a second cell including a second MTJ and a second electrode, a first transistor connected to the first cell and to a first bit line, a second transistor connected to the second cell and to a second bit line, a shared transistor connecting the first cell and the second cell to a source line, a first selector device arranged between the shared transistor and the first electrode, and a second selector device arranged between the shared transistor and the second electrode. The method further includes determining that the first bit for which the stored value is to be determined is in a particular MTJ, wherein the particular MTJ is one of the first MTJ and the second MTJ. The method further includes selectively activating the shared transistor and one of the first transistor and the second transistor to cause current to flow through the particular MTJ, wherein selectively activating the shared transistor and the one of the first transistor and the second transistor causes current to flow through the first selector device when the particular MTJ is the first MTJ and through the second selector device when the particular MTJ is the second MTJ.

Additional embodiments of the present disclosure include a method of forming a two-bit MRAM device. The method includes connecting a first single-bit MRAM cell to a first bit line and to a source line, wherein the first bit line is selectively operated by a first transistor, wherein the first single-bit MRAM cell is connected to the source line through a second transistor, and wherein the first single-bit MRAM cell is connected to the second transistor through a first selector switch device. The method further includes connecting a second single-bit MRAM cell to a second bit line and to the source line, wherein the second bit line is selectively operated by a third transistor, wherein the second single-bit MRAM cell is connected to the source line through the second transistor, and wherein the second single-bit MRAM cell is connected to the second transistor through a second selector switch device. Each of the first single-bit MRAM cell and the second single-bit MRAM cell is programmable by passing a current having a voltage at least as large as a write threshold voltage therethrough. Each of the first selector switch device and the second selector switch device is configured to connect a respective MRAM cell to the shared transistor when activated by a voltage at least as large as an activation threshold voltage. The write threshold voltage is larger than the activation threshold voltage, and the write threshold voltage is smaller than three times the activation threshold voltage.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIG. 5 depicts a flowchart of an example method of programming a first bit of a two-bit MRAM cell, in accordance with embodiments of the present disclosure.

DETAILED DESCRIPTION

Figure 1:
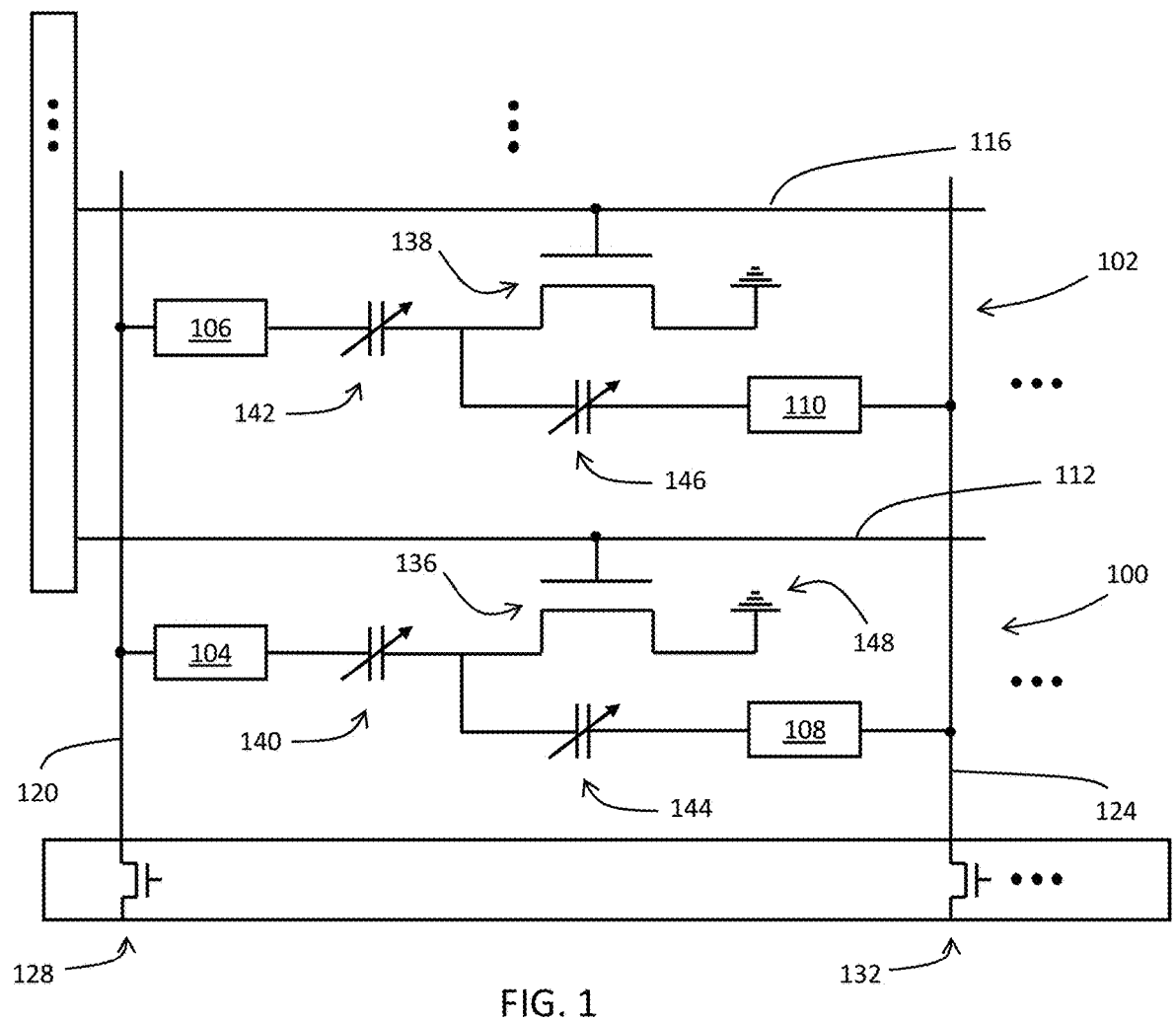
FIG. 1 is a schematic diagram depicting an example configuration of a two-bit magnetoresistive random-access memory (MRAM) cell, in accordance with embodiments of the present disclosure.

Aspects of the present disclosure relate generally to the electrical, electronic, and computer fields, and in particular to two-bit magnetoresistive random-access memory (MRAM) cells having three transistors and methods of manufacturing the same. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, in general, a single-bit MRAM cell refers to any material or combination of materials capable of storing a value (e.g., bit of information) using magnetic storage elements. An MRAM cell value, which can be binary ('1' or '0') or analog (e.g., 0.65), is stored in the memory cell as a function of the cell's electrical resistance, similar to how values are stored in resistive random-access memory (ReRAM or RRAM) cells and/or memristors. In other words, the relative orientation of the magnetization of the plates within the MRAM cell affects the electrical resistance of the MRAM cell. This electrical resistance can be measured by passing a current through the MRAM cell, and the measured electrical resistance can be converted into a value.

A substantial drawback of current single-bit MRAM device architecture is the use of one transistor for each MRAM cell to perform a write operation. This one-to-one ratio of transistors to MRAM cells is important for preventing interference with an unintended MRAM cell that shares a common transistor with the intended MRAM cell. The drawback of this one-to-one ratio is that the required number of transistors limits the bit density of the MRAM device. Moreover, the transistors must be large to support the required driving current for writing operations, further limiting bit density, and thus scaling.

Some attempts to increase the low bit density of MRAM devices have focused on creating multi-bit MRAM cells by using vertically stacked multi-bit cells. However, such solutions fail to address the need for a one-to-one transistor to MRAM cell ratio for read and write operations.

Embodiments of the present disclosure may overcome these and other drawbacks of current solutions by using a two-bit MRAM cell architecture that uses one shared transistor for two single-bit MRAM cells to perform a write operation. In other words, the two-bit MRAM cell architecture disclosed herein is an architecture for linking two single-bit MRAM cells together. Accordingly, it is also possible to refer to the two-bit MRAM cell disclosed herein as a two-bit MRAM device, wherein the two-bit MRAM device includes two separate single-bit MRAM cells that share a common transistor. This architecture is made possible by the incorporation of selector devices, for example selector switches or selector diodes, that prevent unintended access to the other MRAM cell connected to a shared transistor during a read or write operation. This architecture, described in more detail below, reduces by half the number of transistors required for read and write operations for each pair of MRAM cells. Since the cost of processing a silicon wafer is relatively fixed, using smaller cells and so packing more bits on one wafer reduces the cost per bit of memory. Accordingly, halving the number of transistors reduces the density of transistors, which can enable inclusion of a greater number of MRAM cells and/or allow larger transistors to be developed, which provide higher drive current.

According to at least some embodiments of the present disclosure, each two-bit MRAM cell comprises a pair of single-bit MRAM cells. Each single-bit MRAM cell includes a top electrode, a bottom electrode, and a magnetic tunnel junction (MTJ). According to at least some embodiments of the present disclosure, each MTJ includes a free layer in contact with the top electrode, a reference layer in contact with the bottom electrode, and a tunnel barrier arranged between and in contact with the free layer and the reference layer. In other words, in each MTJ stack, the reference layer is separated from the free layer by the tunnel barrier.

The free layer of each single-bit MRAM cell can be programmed independently by passing 'write' current therethrough. Accordingly, by selectively activating the transistors and the selector devices associated with the two-bit MRAM cell, current can be allowed to flow through just one of the single-bit MRAM cells, thereby setting the magnetic orientation of each of the free layers independently. This allows each bit to be individually written to the two-bit MRAM cell.

The state of each single-bit MRAM cell is determined by passing 'read' current through the MTJ stack of the single-bit MRAM cell and measuring the associated resistance state of the corresponding MTJ stack. By selectively activating the transistors and the selector devices associated with the two-bit MRAM cell, current can be allowed to flow through the MTJ stack of just one of the single-bit MRAM cells, thereby reading the magnetic orientation of each of the single-bit MRAM cells independently. This allows the value of each bit of the two-bit MRAM cell to be read individually.

The incorporation of the selector devices in the two-bit MRAM cell architecture allows two single-bit MRAM cells to share a common transistor and allows each bit to be written and read independently while preventing unintended interference with the other bit. This results in a significant space saving for the two-bit MRAM cell. Because two single-bit MRAM cells can share a common transistor and the selective operation of the selective devices allows read and write operations to be performed on each single-bit MRAM cell independently, the number of transistors required for read and write operations for each two-bit MRAM cell is halved.

Additional embodiments of the present disclosure include a method of forming such a two-bit MRAM cell. In at least some embodiments, such a method includes forming a bottom electrode contact for each single-bit MRAM cell of a pair of single-bit MRAM cells, the bottom electrode contacts spaced apart from each other on a common landing pad. Such bottom electrode contacts can be formed, for example, by performing either a subtractive process or a damascene process.

In at least some embodiments, such a method further includes patterning the material of a selector device, such as a selector switch or a selector diode, along with the MRAM device using, for example, ion beam etch (IBE) or reactive ion etch (ME) processes. The material of such selector devices can be, for example, SiOx, TiOx, AlOx, WOx, TiNOx, HfOx, TaOx, NbOx, or a material with similar characteristics. In particular, the material of such selector devices acts as an insulator unless a voltage above a particular threshold voltage is applied, in which case the material acts as a conductor. Additionally, the material of such selector devices is such that said conversion process happens reversibly. In particular, the material acts as an insulator again once the applied voltage is removed.

In at least some embodiments, such a method further includes forming metal lines connecting top electrode contacts of each single-bit MRAM cell of a pair of single-bit MRAM cells. In such embodiments, the metal lines can be formed by performing, for example, a damascene process.

It is to be understood that the aforementioned advantages are example advantages and should not be construed as limiting. Embodiments of the present disclosure can contain all, some, or none of the aforementioned advantages while remaining within the spirit and scope of the present disclosure.

Turning now to the figures, FIG. 1 depicts a block diagram of an example configuration of a two-bit MRAM cell 100, in accordance with embodiments of the present disclosure. The MRAM cell 100 includes a first single-bit MRAM cell 104 and a second single-bit MRAM cell 108. Each of the first and second single-bit MRAM cells 104, 108 provides a single storage bit. Together, these single bits make up the pair of bits of the two-bit MRAM cell 100.

The two-bit MRAM cell 100 can be utilized as part of a larger array of MRAM cells. For example, FIG. 1 depicts a second two-bit MRAM cell 102 that is substantially identical in structure and function to the MRAM cell 100 and is connected to the MRAM cell 100. Accordingly, the second two-bit MRAM cell 102 includes a third single-bit MRAM cell 106 and a fourth single-bit MRAM cell 110 that are arranged and configured to function in a manner substantially identical to the first and second single-bit MRAM cells 104, 108, respectively.

The MRAM cells of the array are connected by word lines, such as first word line 112 and second word line 116, and bit lines, such as first bit line 120 and second bit line 124, to enable programming and reading the bits of information stored in the MRAM cells. The ellipses shown in FIG. 1 indicate that the array may continue with further MRAM cells, connected by further word lines and bit lines, beyond the those shown for illustrative purposes. As shown, the first MRAM cell 100 and the second MRAM cell 102 are connected by the first bit line 120 and the second bit line 124.

The MRAM cell 100 further includes a first transistor 128, which is connected to and associated with the first single-bit MRAM cell 104 by way of the first bit line 120, a second transistor 132, which is connected to and associated with the second single-bit MRAM cell 108 by way of the second bit line 124, and a third transistor 136, which is connected to and associated with both single-bit MRAM cells 104, 108 by way of the first and second bit lines 120, 124 and the first word line 112.

In the embodiment shown, the first transistor 128 and the second transistor 132 are included in a multiplexer 134 which selects between multiple input signals and forwards the selected input to a single output line by operating the corresponding transistor. In alternative embodiments, the first and second transistors may not be part of a multiplexer, but still function in substantially the same manner described below. Similarly, in the embodiment shown, the first word line 112 and the second word line 116 are selectively operated by a row address decoder 118. In alternative embodiments, the first and second word lines may not be selectively operated by a row address decoder, but still function in substantially the same manner described below. The ellipses shown in FIG. 1 indicate that the multiplexer 134 and row address decoder 118 may have connections to further bit lines and word lines, respectively, beyond the those shown for illustrative purposes.

The second MRAM cell 102 is considered to include the same first transistor 128, which is connected to and associated with the third single-bit MRAM cell 106 by way of the first bit line 120, and the same second transistor 132, which is connected to and associated with the fourth single-bit MRAM cell 110 by way of the second bit line 124. In lieu of the third transistor 136, however, the second MRAM cell 102 includes a fourth transistor 138, which is connected to and associated with both single-bit MRAM cells 106, 110 by way of the first and second bit lines 120, 124 and the second word line 116.

The first and second transistors 128, 132, which are connected to the bit lines 120, 124, respectively, and which are shared by multiple two-bit MRAM cells in an array, can be referred to as being located in and/or operated in a "logic area" of a memory storage device. Transistors located in and/or operated in a logic area are used to switch on and off various bit lines and word lines of the array to allow read and write currents to travel to specific locations within the array. In contrast, the third transistor 136, the fourth transistor 138, and similar transistors in other two-bit MRAM cells of the array can be referred to as being located in and/or operated in a "memory area" of a memory storage device. A transistor located in and/or operated in a memory area is used to switch on and off a specific, individual MRAM cell to allow read and write currents to travel through the specific, individual corresponding MRAM cell within the array to perform read and write operations on that corresponding MRAM cell.

The MRAM cell 100 further includes a first selector device 140, which is connected to and associated with the first single-bit MRAM cell 104, and a second selector device 144, which is connected to and associated with the second single-bit MRAM cell 108. More specifically, the first single-bit MRAM cell 104 is connected to the third transistor 136 through the first selector device 140. Similarly, the second single-bit MRAM cell 108 is connected to the third transistor 136 through the second selector device 144.

Notably, in alternative embodiments of the present disclosure, it is possible for the first selector device 140 to be arranged on the opposite side of the first single-bit MRAM cell 104 such that the first single-bit MRAM cell 104 is not necessarily connected to the third transistor 136 through the first selector device 140, but both the first selector device 140 and the first single-bit MRAM cell 104 are connected in series between the first bit line 120 and the third transistor 136. Similarly, in alternative embodiments of the present disclosure, it is possible for the second selector device 144 to be arranged on the opposite site of the second single-bit MRAM cell 108 such that the second single-bit MRAM cell 108 is not necessarily connected to the third transistor 136 through the second selector device 144, but both the second selector device 144 and the second single-bit MRAM cell 108 are connected in series between the second bit line 124 and the third transistor 136.

Likewise, the second MRAM cell 102 includes a third selector device 142 and a fourth selector device 146 arranged such that the third single-bit MRAM cell 106 is connected to the fourth transistor 138 through the third selector device 142 and the fourth single-bit MRAM cell 110 is connected to the fourth transistor 138 through the fourth selector device 146.

In the embodiment shown in FIG. 1, each of the selector devices 140, 142, 144, and 146 is a selector switch. Each of the selector switches is configured to be closed by applying a voltage across the switch. In particular, to activate the selector switch (also referred to as "closing" or "turning on" the selector switch), a voltage across the switch must be at least as large as a particular switch threshold Vs. In accordance with at least some embodiments of the present disclosure, all of the selector switches have the same switch threshold Vs. As discussed in further detail below, however, it is possible in alternative embodiments to configure the selector switches to have switch thresholds that are different from one another.

Each of the transistors 128, 132, 134, and 136 is a semiconductor device used as an electrically controlled switch. Thus, each of the transistors 128, 132, 134, 136 is used to switch on and off the flow of electrical current therethrough. Each transistor conducts current only when a voltage is applied to its gate. In other words, when no voltage is applied to the transistor's gate, the switch is off and no current is conducted through the transistor. In contrast, when voltage is applied to the transistor, the switch is on and current is conducted through the transistor. In alternative embodiments, it may be possible for the transistors to operate in a different manner known to one of ordinary skill in the art or for a different type of transistor to be used.

As explained in further detail below, the inclusion, switch threshold voltages, and particular arrangement of the selector devices 140, 142, 144, 146 enable the first and second single-bit MRAM cells 104, 108 to share the common third transistor 136 while keeping operations pertaining to the first single-bit MRAM cell 104 separate from those pertaining to the second single-bit MRAM cell 108.

Figure 2:
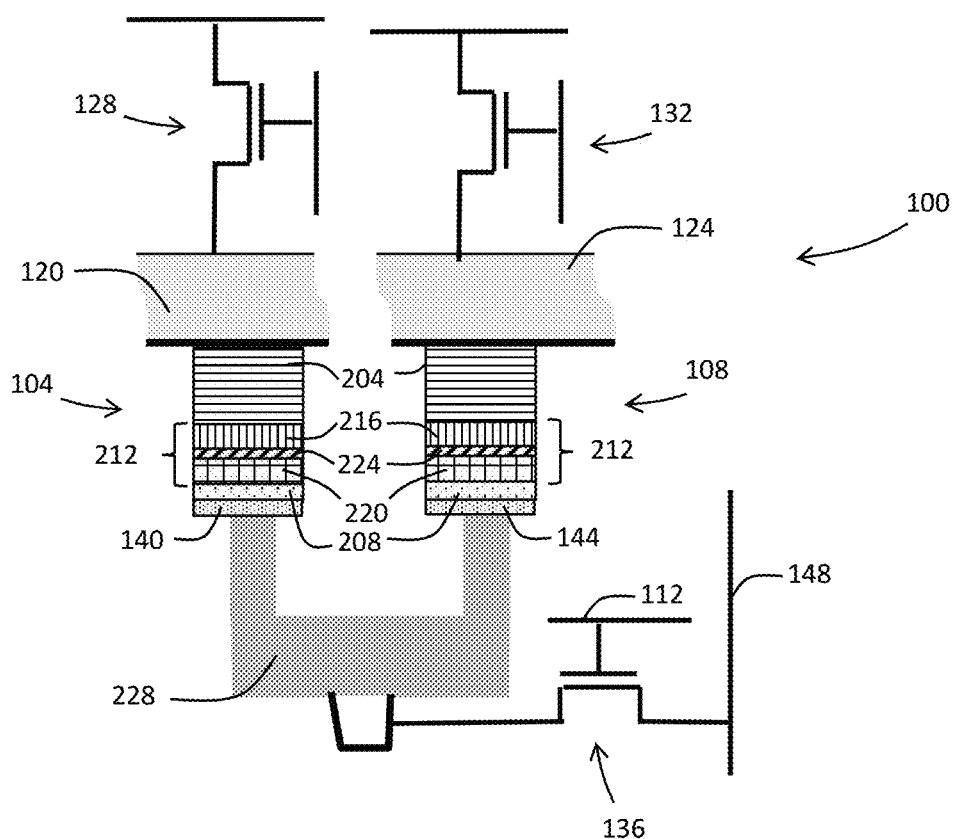
FIG. 2 is a schematic diagram depicting a cross-sectional view of a portion of a two-bit MRAM cell, such as that shown in FIG. 1, in accordance with embodiments of the present disclosure.

Turning now to FIG. 2, a schematic drawing of the first MRAM cell 100 in a side elevational view depicts the architecture of each single-bit MRAM cell in more detail. In particular, each single-bit MRAM cell 104, 108 includes a top electrode 204, which is arranged nearest to the respective bit line 120, 124, and a bottom electrode 208, which is arranged nearest to the third transistor 136. Each single-bit MRAM cell 104, 108 further includes an MTJ 212 arranged between the top electrode 204 and the bottom electrode 208. Each MTJ 212 includes a free layer 216, arranged nearest to the top electrode 204, a reference layer 220, arranged nearest to the bottom electrode 208, and a tunnel barrier layer 224, arranged between the free layer 216 and the reference layer 220.

Figure 3:
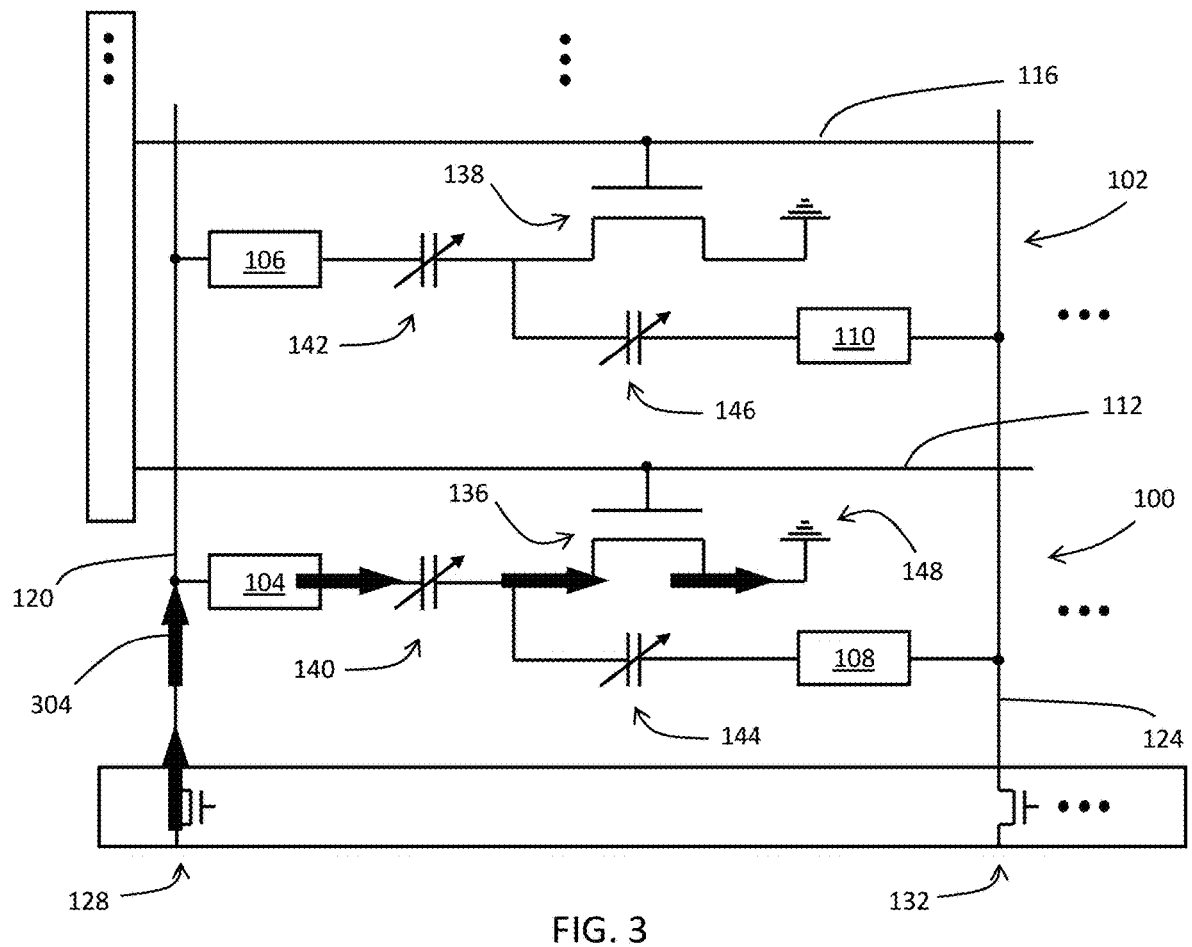
FIG. 3 is a schematic diagram depicting the example configuration of the two-bit MRAM cell shown in FIG. 1 which indicates a primary path of the cell, in accordance with embodiments of the present disclosure.

As noted above, to program a single-bit MRAM cell, a write current is passed therethrough, altering the free layer therein. Accordingly, in the context of the two-bit MRAM cell 100, to program a first of the two bits, the first single-bit MRAM cell 104 is selected by turning on the first transistor 128, which activates the first bit line 120, to which the first single-bit MRAM cell 104 is connected. Additionally, by applying a voltage to the first word line 112, the third transistor 136 is turned on, which allows current to flow through the first single-bit MRAM cell 104 to a source line 148 as shown in FIG. 3. In the embodiment shown in FIG. 1, the source line 148 is shown as a ground. However, in alternative embodiments, the source line 148 can be a ground, a neutral, or another common line which completes the circuit. In accordance with at least some embodiments of the present disclosure, the source line 148 feeds the signal to a sense amplifier circuit to determine the bit value.

Importantly, while the first single-bit MRAM cell 104 is being programmed, the second transistor 132 is turned off. This prevents current from being passed along the second bit line 124 and through the second single-bit MRAM cell 108, which would alter the free layer 216 of the second single-bit MRAM cell 108 while the first single-bit MRAM cell 104 is being programmed. Additionally, as explained in further detail below, the selector device 144, in conjunction with selector devices 142, 146, prevents current from flowing into the free layer 216 of the second single bit MRAM cell 108, which could happen even with the second transistor 132 being off (e.g., due to effects such as leakage and parasitic capacitances in the circuit, such as in the second transistor), as well as due to alternate paths through the array, as described below with respect to FIG. 4.

Accordingly, while performing a write operation to program the first bit of the two-bit MRAM cell 100, when the bit of the first single-bit MRAM cell 104 is to be programmed, the first transistor 128 is turned on, the second transistor 132 is turned off, and the third transistor 136 is turned on. In contrast, as explained in further detail below, when the bit of the second single-bit MRAM cell 108 is to be programmed, the first transistor 128 is turned off, the second transistor 132 is turned on, and the third transistor 136 is turned on.

Continuing with the example of programming the bit of the first single-bit MRAM cell 104, to alter the free layer 216 in the first single-bit MRAM cell 104, the write voltage must be above a particular write threshold Vw. Accordingly, the write current, which is passed along the first bit line 120 and through the first single-bit MRAM cell 104 has a voltage that is as least as large as the write threshold Vw. In the embodiments disclosed herein, the write threshold Vw is larger than the switch threshold Vs of the first selector switch 140.

As shown in FIG. 3, during an operation to program first single-bit MRAM cell 104, the write current travels along the path which is indicated for illustrative purposes by the arrows 304. The write current is driven by a voltage that is at least as large as the write threshold Vw, which is sufficient to alter the free layer 216 of the first single-bit MRAM cell 104. Because, as mentioned above, write threshold Vw is larger than the switch threshold Vs of the first selector switch 140, the write current is also sufficient to close (turn on) the first selector switch 140. Accordingly, because the first transistor 128, the first selector switch 140, and the third transistor 136 are all turned on, the write current travels along the path 304 to the source line 148 and programs the first single-bit MRAM cell 104 as it passes therethrough.

Because the second transistor 132 is off, the path 304 is the preferred path (also referred to as the "primary path") for the write current through the two-bit MRAM cell 100 to the source line 148. In contrast, FIG. 4 depicts an alternate path (also referred to as the "secondary path"), which is indicated for illustrative purposes by the arrows 404, for the write current through the two-bit MRAM cell 100 to the source line 148.

Figure 4:
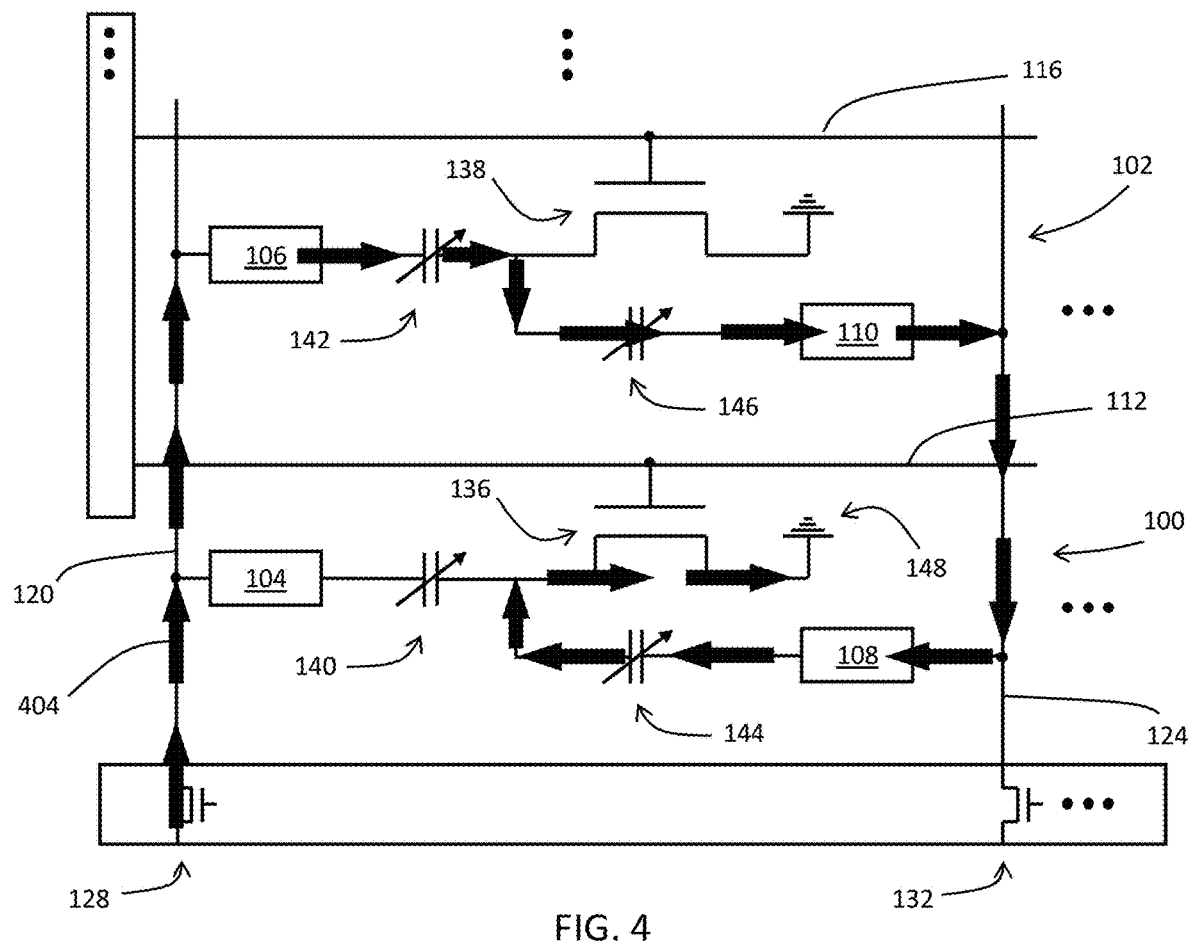
FIG. 4 is a schematic diagram depicting the example configuration of the two-bit MRAM cell shown in FIG. 1 which indicates a secondary path of the cell, in accordance with embodiments of the present disclosure.

As shown in FIG. 4, the secondary path 404 for the write current through the two-bit MRAM cell 100 to the source line 148 includes the first bit line 120, the third single-bit MRAM cell 106, the third selector switch 142, the fourth selector switch 146, the fourth single-bit MRAM cell 110, the second bit line 124, the second single-bit MRAM cell 108, the second selector switch 144, and the third transistor 136. Accordingly, the secondary path 404 illustrates that it would be possible for a write current that is intended to program the first single-bit MRAM cell 104 to inadvertently impact the second single-bit MRAM cell 108. A current which travels along this secondary path 404 and inadvertently impacts the unintended single-bit MRAM cell of the two-bit MRAM cell may be referred to as "sneak current" or "leak current."

To prevent the sneak current from passing through the second single-bit MRAM cell 108 during a write operation intended to program the first single-bit MRAM cell 104, the secondary path 404 must be interrupted. To interrupt the secondary path 404, each of the selector switches 140, 142, 144, 146 is configured such that the switch threshold Vs is less than the write threshold Vw and such that the sum of three of the switch thresholds Vs is greater than the write threshold Vw. In other words, the selector switches 140, 142, 144, 146 are configured such that Vs<Vw<3Vs.

Because the third, fourth, and second selector switches 142, 146, 144 are connected in series along the secondary path 404, their switch thresholds are cumulative. Accordingly, in order to complete the circuit such that passage of the write current along the secondary path 404 possible, the voltage of the write current must be larger than the switch thresholds of the third, fourth, and second selector switches 142, 146, 144 added together. By configuring the selector switches 140, 142, 144, 146 such that Vw<3Vs, the write current is insufficient to activate the third, fourth, and second selector switches 142, 146, 144, and therefore the secondary path 404 is interrupted and the sneak current is prevented from unintentionally passing through the second single-bit MRAM cell 108.

Accordingly, the inclusion and arrangement of the selector switches makes it possible to prevent the sneak current from passing through the second single-bit MRAM cell 108 by configuring the two-bit MRAM cell 100 such that the write current has a voltage that is sufficient to alter the free layer 216 of the first single-bit MRAM cell 104, is sufficient to close the first selector switch 140, and is insufficient to close all three of the third, fourth, and second selector switches 142, 146, 144 in series.

As one example, if the write threshold Vw is 500 millivolts, this could be achieved by configuring all of the selector switches 140, 142, 144, 146 to have a switch threshold Vs of approximately 200 millivolts. This example satisfies the condition of Vs<Vw<3Vs because 200<500<600. In such an example, a write current of approximately 500 millivolts is sufficient to alter the free layer 216 of the first single-bit MRAM cell 104 and is sufficient to close the first selector switch 140, but it is insufficient to close all three of the third, fourth, and second selector switches 142, 146, 144.

In the foregoing illustrative discussion, the first single-bit MRAM cell 104 is the first of the two bits of the MRAM cell 100 to be programmed. It is possible, of course, for the second single-bit MRAM cell 108 to be the first of the two bits of the MRAM cell to be programmed instead. It is analogously possible to program the second single-bit MRAM cell 108 of the MRAM cell 100 in the same manner by turning off the first transistor 128, turning on the second transistor 132, and turning on the third transistor 136. When the first transistor 128 is turned off and the second and third transistors 132, 136 are turned on, the primary path for the write current travels along the second bit line 124, through the second single-bit MRAM cell 108, through the second selector switch 144, through the third transistor 136, and to the source line 148. The secondary path for the write current travels along the second bit line 124, through the fourth single-bit MRAM cell 110, through the fourth selector switch 146, through the third selector switch 142, through the third single-bit MRAM cell 106, through the first bit line 120, through the first single-bit MRAM cell 104, through the first selector switch 140, and through the third transistor 136 to the source line 148.

Accordingly, in substantially the same manner as described above, it is possible to prevent the write current intended to program the second single-bit MRAM cell 108 from sneaking along the secondary path and unintentionally altering the first single-bit MRAM cell 104 by configuring the MRAM cell 100 such that the switch thresholds relative to the write threshold satisfy the condition $Vs<Vw<3Vs$.

As noted above, to determine the state of a two-bit MRAM cell, a read current is passed through the MTJ stack of each single-bit MRAM cell. Accordingly, in the context of the two-bit MRAM cell 100, the value of each bit is read individually in a manner substantially similar to the write process described above.

To read the value of a bit without interfering with the value of the bit, a read current has a voltage that is less than that of a write current. Accordingly, the read current can be passed through the MTJ to determine the value of the free layer without altering the free layer. More specifically, to read the value stored by the MTJ, the read voltage must be above a particular read threshold Vr, and to prevent interfering with the value of the bit, the read voltage must be less than the write threshold Vw. Thus, the read threshold Vr is less than the write threshold Vw. In other words, $Vr<Vw$.

Moreover, analogously to the write operations described above, the read current must have a voltage that is at least as great as the read threshold Vr and that is less than three times the switch threshold Vs. In other words, $Vs<Vr<3Vs$. Accordingly: $Vs<Vr<Vw<3Vs$. Continuing with the example voltages provided above, if the write threshold Vw is approximately 500 millivolts and the switch threshold Vs is approximately 200 millivolts, the read threshold Vr could be, for example, approximately 300 millivolts. This example satisfies the condition of $Vs<Vr<Vw<3Vs$ because $200<300<500<600$.

During an operation to read a first of the two bits, the first transistor 128 is turned on, the second transistor 132 is turned off, and the third transistor 136 is turned on. Accordingly, the read current, which has a voltage of, for example approximately 300 millivolts, travels along the primary path 304 (shown in FIG. 3) to read the value of the first single-bit MRAM cell 104. Additionally, the third, fourth, and second selector switches 142, 146, 144, each of which has an individual switch threshold of, for example 200 millivolts such that a combined switch threshold is, for example approximately 600 millivolts, prevent current leakage from traveling along the secondary path 404 (shown in FIG. 4) and passing through the second single-bit MRAM cell 108.

It should be understood that it is analogously possible to read the value stored by the second single-bit MRAM cell 108 of the MRAM cell 100 in the same manner by turning off the first transistor 128, turning on the second transistor 132, and turning on the third transistor 136. When the first transistor 128 is turned off and the second and third transistors 132, 136 are turned on, the primary path for the read current travels along the second bit line 124, through the second single-bit MRAM cell 108, through the second selector switch 144, through the third transistor 136, and to the source line 148. The secondary path for the read current travels along the second bit line 124, through the fourth single-bit MRAM cell 110, through the fourth selector switch 146, through the third selector switch 142, through the third single-bit MRAM cell 106, through the first bit line 120, through the first single-bit MRAM cell 104, through the first selector switch 140, and through the third transistor 136 to the source line 148.

Accordingly, in substantially the same manner as described above, it is possible to prevent the read current intended to determine the value stored by the second single-bit MRAM cell 108 from sneaking along the secondary path and unintentionally reading the first single-bit MRAM cell 104 by configuring the switch thresholds relative to the read threshold such that $Vs<Vr<3Vs$. As noted above with respect to individually programming the single-bit MRAM cells 104, 108, it is possible to read the value stored by the single-bit MRAM cells 104, 108 in either order.

In order for the selector switches to direct the read and write currents in the manner described above, each of the first and second selector switches 140, 144 must be arranged between the junction where the primary path and the secondary path rejoin one another and the top electrode 204 of the corresponding single-bit MRAM cell.

For example, in the embodiment depicted in FIG. 2, the first selector switch 140 is directly connected to the bottom electrode 208 of the first single-bit MRAM cell 104 such that the first selector switch 140 is arranged between the bottom electrode 208 and a shared bottom contact 228 where the primary path and the secondary path rejoin one another. In accordance with alternative embodiments of the present disclosure, it is possible for the first selector switch 140 to be arranged at another location between the respective bit line 120 and the shared bottom contact 228 where the primary path and the secondary path rejoin one another. For example, in accordance with an alternative embodiment of the present disclosure, it is possible for the first selector switch 140 to be arranged between the top electrode 204 and the MTJ 212. In accordance with another embodiment of the present disclosure, it is possible for the first selector switch 140 to be arranged between two layers of the bottom electrode 208 or the top electrode 204.

FIG. 5 depicts a flowchart of a method 500 of operating the two-bit MRAM cell 100. The two-bit MRAM cell is operated by, or as part of, a memory system (also referred to herein as a memory storage device) which includes an array of two-bit MRAM cells such as the two-bit MRAM cells 100, 102 shown in FIG. 1. The method 500 may be performed by hardware, firmware, software executing on a processor, or any combination thereof. For example, the method 500 may be performed by a memory controller (e.g., in a processor).

At operation 504, the system receives a write command to program a first bit or a read command to determine the value stored in a first bit. At operation 508, the system determines that the first bit is to be stored or is stored in a particular MTJ. As an illustrative example, the system determines that the first bit is to be stored or is to be stored in the MTJ 212 (shown in FIG. 2) of the first single-bit MRAM cell 104 of the two-bit MRAM cell 100.

At operation 512, the system selectively activates transistors to cause current to flow through the particular MTJ. As an illustrative example, the system selectively activates the first transistor 128 and the third transistor 136 (shown in FIG. 1) to cause the write current or read current to flow through the MTJ 212 of the first single-bit MRAM cell 104 of the two-bit MRAM cell 100.

Due to the arrangement of the transistors and the selector switches in the two-bit MRAM cell and the relative voltages and threshold voltages of the single-bit MRAM cells and selector switches, causing current to flow through the particular MTJ also causes current to flow through the selector device that corresponds to the particular MTJ. According to the illustrative example, causing current to flow through the MTJ 212 of the first single-bit MRAM cell 104 causes current to flow through the first selector switch 140. As described above, this flow occurs because the read and write voltages of the first single-bit MRAM cell 104 are greater than the threshold voltage of the first selector switch 140. Accordingly, causing current to flow through the particular MTJ includes causing current to flow through the corresponding selector device.

The illustrative example set forth above describes the method 500 when the method is used to program or to read the first single-bit MRAM cell 104. In other words, the same method 500 is used to perform either a read operation or a write operation. Moreover, it is to be understood that the same method 500 is used to program or read either the first single-bit MRAM cell 104 or the second single-bit MRAM cell 108 when it is determined at operation 508 that the particular MTJ is the MTJ 212 of the second single-bit MRAM cell 108 of the two-bit MRAM cell 100. This is done by simply changing which of the first and second transistor is activated.

As noted above, in the embodiments of the MRAM cells 100, 102 shown in FIGS. 1, 3, and 4, the selector devices 140, 142, 144, 146 are selector switches. In alternative embodiments, however, the selector devices 140, 142, 144, 146 can be selector diodes. In further alternative embodiments, some of the selector devices may be selector switches and some may be selector diodes.

Figure 6:
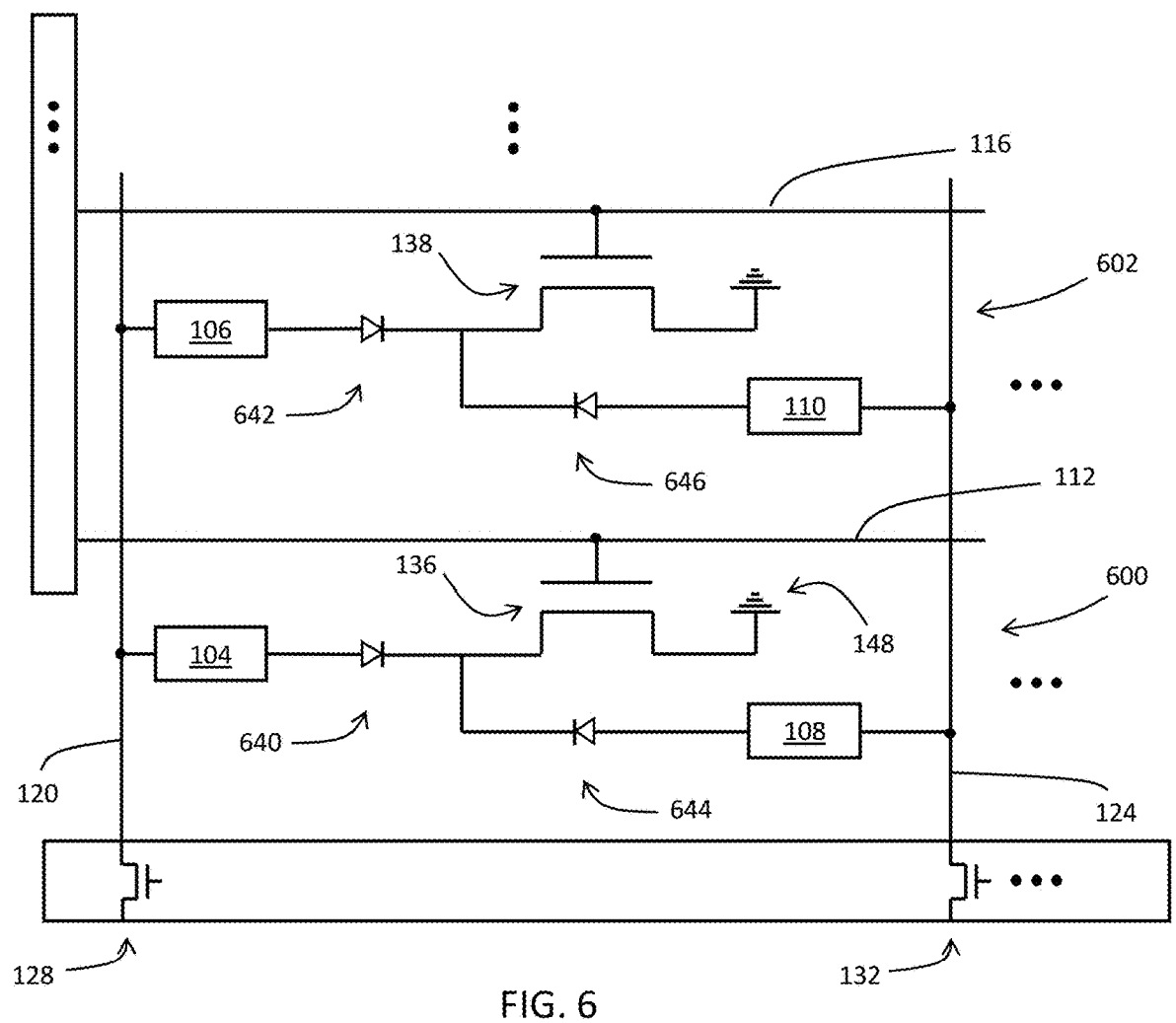
FIG. 6 is a schematic diagram depicting another example configuration of a two-bit MRAM cell, in accordance with embodiments of the present disclosure.

FIG. 6 depicts an embodiment of the present disclosure wherein the selector devices 140, 142, 144, 146 are selector diodes. Each selector diode is configured to conduct current primarily in one direction, commonly referred to as the "forward" direction. Accordingly, embodiments of the MRAM cells 100, 102 which include selector switches may be referred to as having "symmetric" selector devices while embodiments of the MRAM cells 100, 102 which include selector diodes may be referred to as having "asymmetric" selector devices.

More specifically, a diode has a low resistance in the forward direction and a high resistance in the opposite direction, commonly referred to as the "reverse" direction. Each of the selector diodes in the MRAM cells 100, 102 are configurable such that the voltage thresholds can be independently selected for current traveling in the forward direction relative to the diode and for current traveling in the reverse direction relative to the diode. Thus, using selector diodes in lieu of selector switches enables the two-bit MRAM cells 100, 102 to be more finely tuned in terms of controlling current flow by more specifically selecting the voltage thresholds of each of the selector diodes.

In accordance with some embodiments of the present disclosure, it is possible for each selector diode to have forward and reverse threshold voltages that are the same as those of the other selector diodes. In accordance with some embodiments of the present disclosure, it is possible for the selector diodes to have forward and reverse threshold voltages that are different than those of other selector diodes. In accordance with some embodiments of the present disclosure, it is possible for a selector diode to have a forward threshold voltage that is the same as its reverse threshold voltage. In accordance with some embodiments of the present disclosure, it is possible for a selector diode to have a forward threshold voltage that is different than its reverse threshold voltage.

As shown in FIG. 6, the arrangement of the two-bit MRAM cells 600, 602 is identical to that of two-bit MRAM cells 100, 102 shown and described above except that the selector switches 140, 142, 144, 146 are replaced by selector diodes 640, 642, 644, 646. In the embodiment shown in FIG. 6, each of the selector diodes 640, 642, 644, 646 is arranged such that the forward direction of the diode points toward the respective shared transistor 136, 138. In some alternative embodiments, it may be possible to arrange at least some of the selector diodes such that the forward direction points away from the respective shared transistor as long as the functionality of the selector diodes, to enable the two single-bit MRAM cells of a two-bit MRAM cell to share a common transistor, is preserved.

Figure 7:
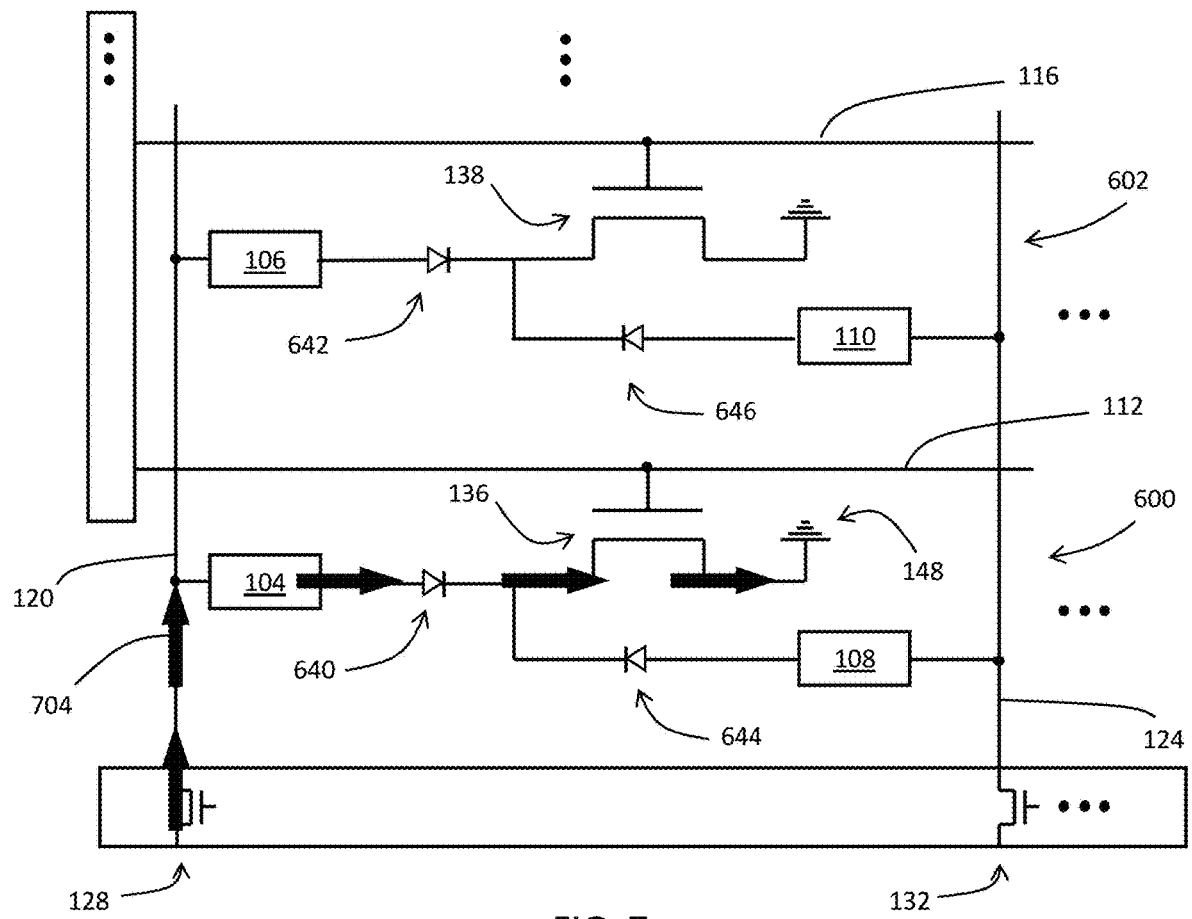
FIG. 7 is a schematic diagram depicting the example configuration of the two-bit MRAM cell shown in FIG. 6 which indicates a primary path of the cell, in accordance with embodiments of the present disclosure.

As shown in FIG. 7, in operation, the primary path 704 of a read or write current intended to perform a read or write operation on the first single-bit MRAM cell 104 travels along the bit line 120, through the first single-bit MRAM cell 104, through the first selector diode 640 in the forward direction, and through the third transistor 136 to the source line 148.

Figure 8:
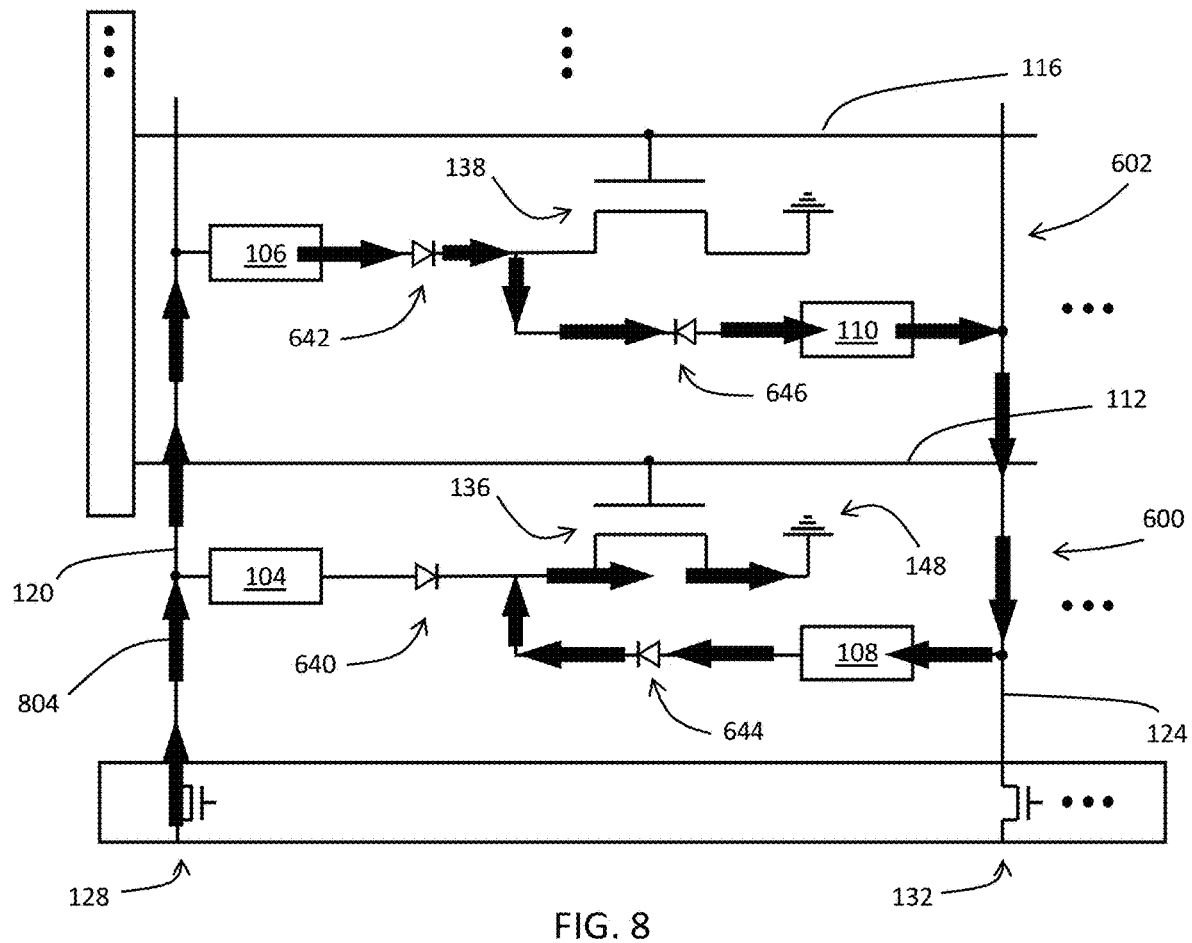
FIG. 8 is a schematic diagram depicting the example configuration of the two-bit MRAM cell shown in FIG. 1 which indicates a secondary path of the cell, in accordance with embodiments of the present disclosure.

As shown in FIG. 8, in operation, the secondary path 804 of a read or write current intended to perform a read or write operation on the first single-bit MRAM cell 104 travels along the bit line 120, through the third single-bit MRAM cell 106, through the third selector diode 642 in the forward direction, through the fourth selector diode 646 in the reverse direction, through the fourth single-bit MRAM cell 110, along the second bit line 124, through the second single-bit MRAM cell 108, through the second selector diode 644 in the forward direction, and through the third transistor 136 to the source line 148.

Accordingly, in order to allow the read or write current to travel along the intended primary path 704 while preventing the read or write current from traveling along the unintended secondary path 804, the relative threshold voltages can be selected in the following manner. The forward threshold voltage Vdf for each of the selector diodes is less than the voltage of the read current (Vr) and the voltage of the write current (Vw) such that the read and write currents are able to pass through the first selector diode 640 in primary path 704. The sum of the forward threshold voltage Vdf of the third selector diode 642, the reverse threshold voltage Vdr of the fourth selector diode 646, and the forward threshold voltage Vdf of the fourth selector diode 644 is greater than each of the read and write currents. In other words, Vdf<Vr<Vw<(2Vdf+Vdr).

In one illustrative example, the forward threshold voltage Vdf to activate each of the selector diodes in the forward direction can be approximately 200 millivolts, the reverse threshold voltage Vdr to activate each of the selector diodes in the reverse direction can be approximately 400 millivolts, the voltage of the read current Vr can be approximately 300 millivolts, and the voltage of the write current Vw can be approximately 500 millivolts. This example satisfies the conditions Vdf<Vr<Vw<(2Vdf+Vdr) because 200<300<500<800. In alternative embodiments, it is possible for the components to have different voltages so long as the conditions Vdf<Vr<Vw<(2Vdf+Vdr) remain satisfied. In at least one alternative embodiment, it is possible for the reverse threshold voltage Vdr to be significantly larger than the forward threshold voltage Vdf such that a read or write voltage would not be able to pass through a single diode oriented in the reverse direction.

Figure 9:
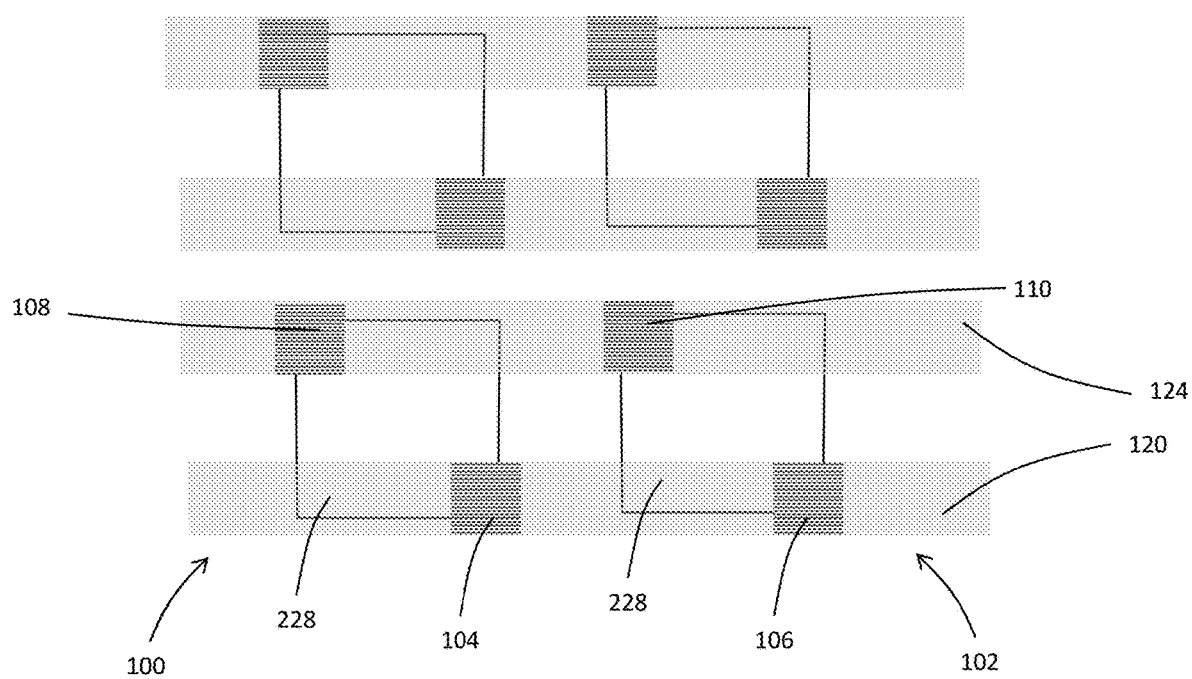
FIG. 9 is a schematic diagram depicting a top plan view of a two-bit MRAM cell, in accordance with embodiments of the present disclosure.

FIG. 9 depicts a top plan view of the two-bit MRAM cells 100, 102 (which could be 600, 602 instead) as well as two further two-bit MRAM cells 900, 902 in an array. In the manner described above, the first single-bit MRAM cell 104 and the second single-bit MRAM cell 108 share the common bottom contact 228. The first single-bit MRAM cell 104 and the second single-bit MRAM cell 108 further share the third transistor, which is not visible in FIG. 9 because it is obscured by the bottom contact 228. Additionally, the first single-bit MRAM cell 104 and the third single-bit MRAM cell 106 are both connected to the first bit line 120, and the second single-bit MRAM cell 108 and the fourth single-bit MRAM cell 110 are both connected to the second bit line 124. The further two-bit MRAM cells 900, 902 are arranged and connected and function in substantially the same manner. For example, first and second single-bit MRAM cells of each of the two-bit MRAM cells 900, 902 share bottom contacts and first and third single-bit MRAM cells are connected to a first bit line 920 and second and fourth single-bit MRAM cells are connected to a second bit line 924. This arrangement can be formed by, for example, the method 1000 shown in FIG. 10.

Figure 10:
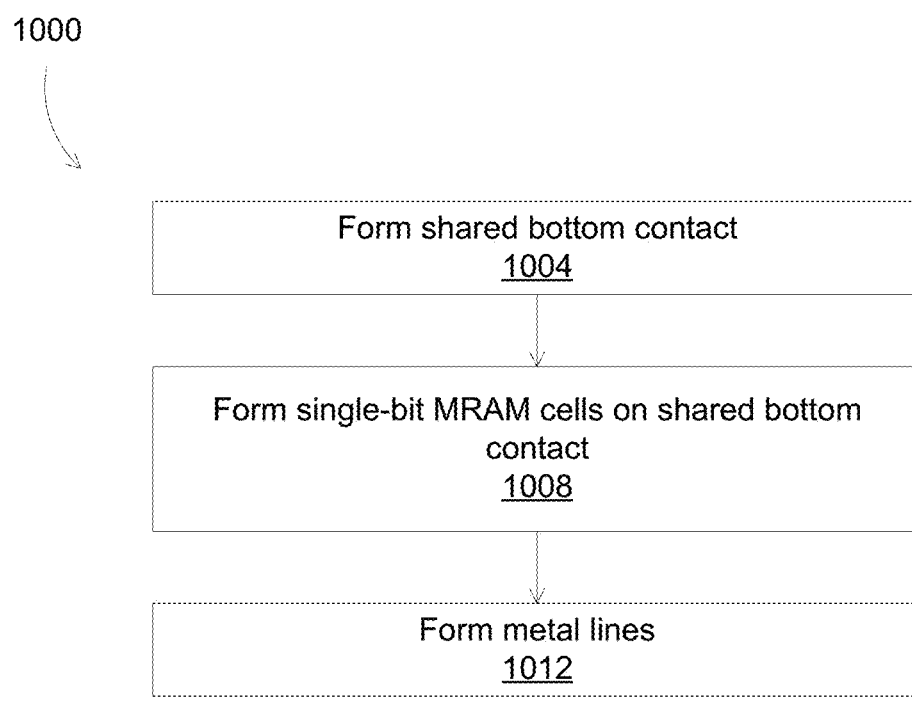
FIG. 10 depicts a flowchart of an example method of forming a two-bit MRAM cell, in accordance with embodiments of the present disclosure.

FIG. 10 depicts an example method 1000 for forming the above described arrangement, which can be used in a memory storage device. The method 1000 begins at operation 1004, wherein the shared bottom contact, also referred to as a shared landing pad, is formed. In the context of the MRAM cell 100 shown in FIG. 2, the shared landing pad is analogous to the shared bottom contact 228. In particular, the shared landing pad is formed of a conductive material, for example, a metal such as ruthenium.

Figure 11A:
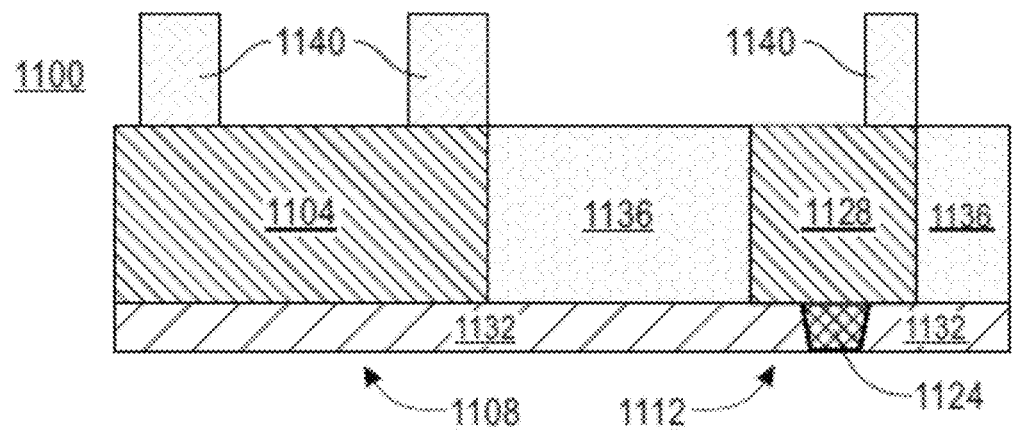
FIG. 11A depicts a schematic side cross-sectional drawing of a two-bit MRAM cell following the performance of a portion of the method shown in FIG. 10, in accordance with embodiments of the present disclosure.

FIG. 11A depicts a schematic drawing of a partial side cross-sectional view of a memory storage device 1100 following the performance of operation 1004. As shown, in at least some embodiments of the present disclosure, the shared landing pad 1128 can be formed at the same time, as part of the same process, and/or of the same material as a metal line 1104 in a logic area 1108 of the memory storage device 1100. Moreover, in at least some embodiments of the present disclosure, the shared landing pad 1128 of a memory area 1112 and the metal line 1104 of the logic area 1108 are formed on an oxide layer 1132. Furthermore, the shared landing pad 1128 is formed in direct contact with a contact 1124 that is formed in, and otherwise isolated by, the oxide layer 1132. In the context of the MRAM cell 100 shown in FIG. 2, this contact 1124 is analogous to the contact which connects the shared bottom contact 228 with the third transistor 136.

Additionally, FIG. 11A illustrates an interlayer dielectric (ILD) 1136, which can be used to separate the shared landing pad 1128 from the metal line 1104 and from shared landing pads of other MRAM cells in the array. In at least some embodiments of the present disclosure, the ILD can be formed of, for example, an ultra-low dielectric constant (ULK) material.

Additionally, FIG. 11A illustrates a mask 1140 selectively formed on top of portions of the metal line 1104 and shared landing pad 1128. As described in further detail below, the mask 1140 facilitates subsequent operations in the fabrication process.

Figure 11B:
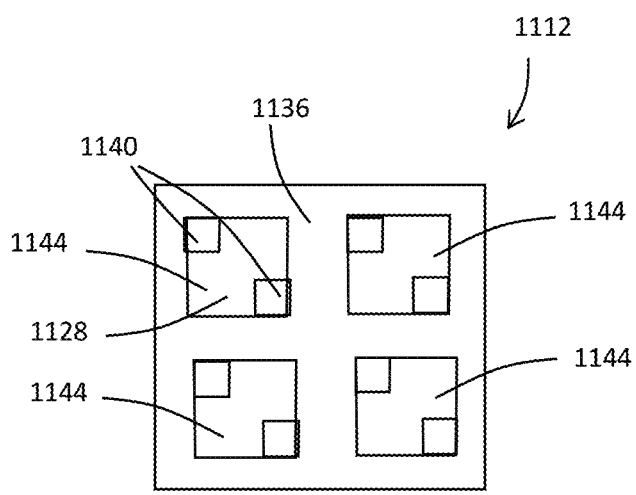
FIG. 11B depicts a schematic top plan drawing of a two-bit MRAM cell shown in FIG. 11A, in accordance with embodiments of the present disclosure.

FIG. 11B depicts a schematic drawing of a partial top view of the memory area 1112 of the memory storage device 1100 shown in FIG. 11A. For illustrative purposes, the memory area 1112 includes four two-bit MRAM cells 1144 formed in the manner shown in FIG. 11A and by the operation 1004 of method 1000.

Figure 12A:
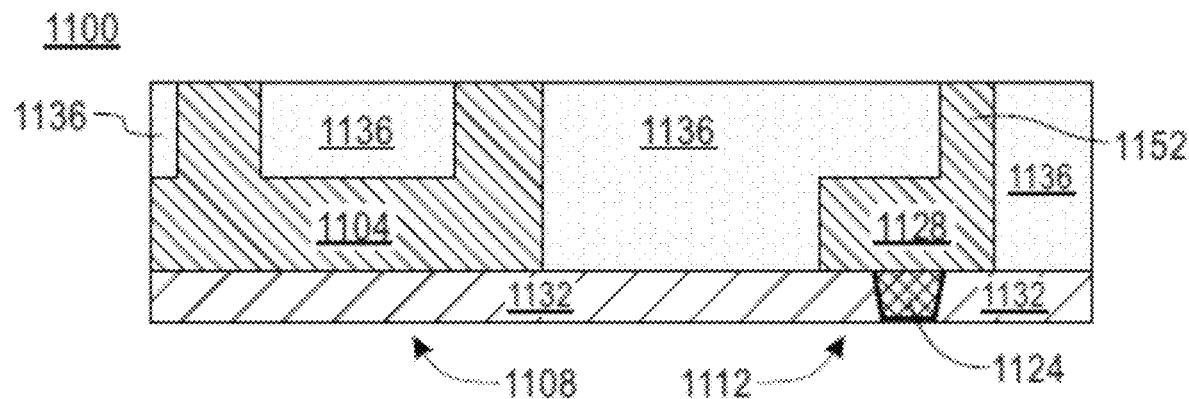
FIG. 12A depicts a schematic side cross-sectional drawing of a two-bit MRAM cell shown in FIG. 11A following the performance of a portion of the method, in accordance with embodiments of the present disclosure.
Figure 12B:
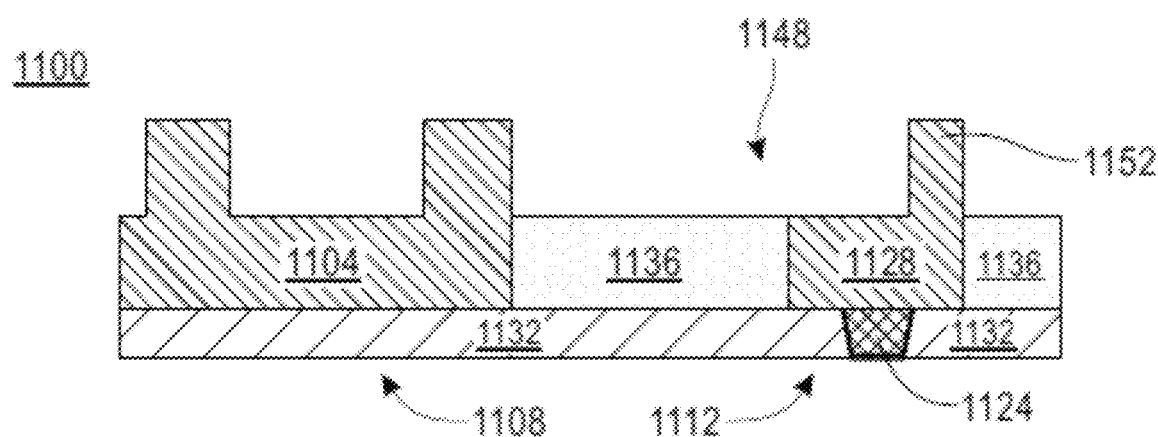
FIG. 12B depicts a schematic side cross-sectional drawing of a two-bit MRAM cell shown in FIG. 12A following the performance of a portion of the method, in accordance with embodiments of the present disclosure.
Figure 12C:
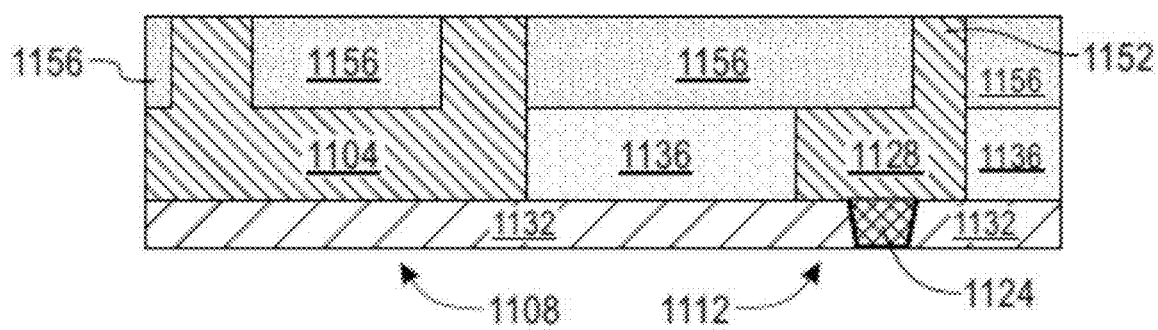
FIG. 12C depicts a schematic side cross-sectional drawing of a two-bit MRAM cell shown in FIG. 12B following the performance of a portion of the method, in accordance with embodiments of the present disclosure.

FIGS. 12A, 12B, and 12C illustrate the memory storage device 1100 following the performance of further fabrication processes which form the shared bottom contact 1128. In other words, the further fabrication processes (the results of which are shown in FIGS. 12A, 12B, and 12C) can be considered to be performed in the performance of operation 1004 of method 1000. The fabrication operations shown in FIGS. 12A-12C can be performed using fabrication processes (e.g., ILD fill, CMP) that are known to those of ordinary skill in the art. In particular, FIG. 12A illustrates the result of forming the top via by etching the metal line 1104 and the shared landing pad 1128 using mask 1140 and then performing an ILD fill process and a subsequent CMP process. The ILD fill process can be performed using the same material or a different material as the preexisting ILD 1136. FIG. 12B illustrates the result of forming an ILD recess 1148 and a microstud 1152 self-aligned with the shared landing pad 1128. FIG. 12C illustrates the result of performing a cap dielectric fill process and a subsequent CMP process. The cap dielectric fill process can be performed using a flowable dielectric material 1156 such as, for example, SiCN(H).

Figure 12D:
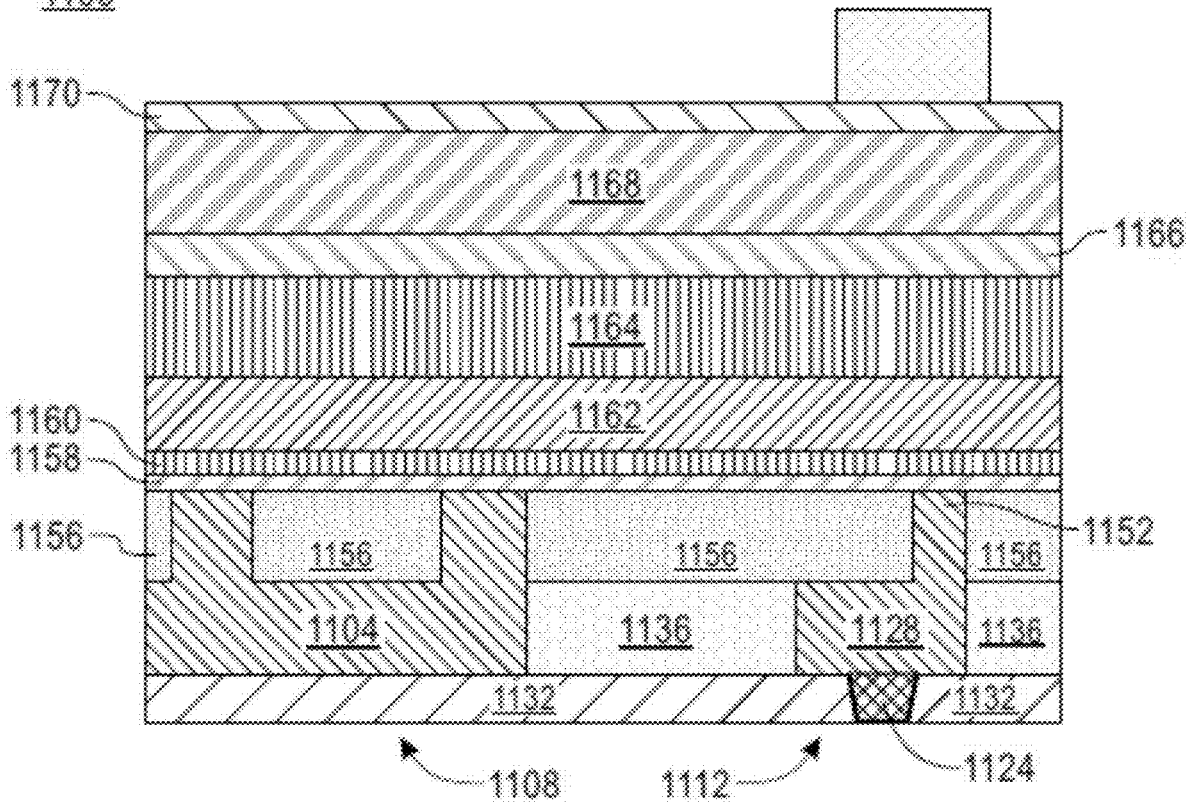
FIG. 12D depicts a schematic side cross-sectional drawing of a two-bit MRAM cell shown in FIG. 12C following the performance of a portion of the method, in accordance with embodiments of the present disclosure.

Returning to FIG. 10, the method 1000 proceeds with operation 1008, wherein the first and second single-bit MRAM cells are formed on the shared bottom contact 1128. The MRAM cells may be formed using fabrication processes (e.g., deposition processes) that are known in the art. In at least some embodiments of the present disclosure, operation 1008 can include depositing the layers of the MRAM cells by performing litho patterning and/or masking processes. More specifically, as illustrated by FIG. 12D, the performance of operation 1008 can include the sequential formation of layers of material which form the selector devices, the bottom electrodes, the MTJs, and the top electrodes of the MRAM cells. In other words, in at least some embodiments of the present disclosure, forming the MRAM cells at operation 1008 includes forming the selector devices that correspond to those MRAM cells. In such embodiments, forming the selector devices can include patterning a selector device material, for example, by performing an etch process. Furthermore, in such embodiments, the selector device material can include, for example, at least one of SiOx, TiOx, AlOx, WOx, TiNOx, HfOx, TaOx, and NbOx.

In the embodiment shown in FIG. 12D, the layer(s) of material(s) which form(s) the selector devices is/are indicated with reference numeral 1158, the layer(s) of material(s) which form(s) the bottom electrodes is/are indicated with reference numeral 1160, the layer(s) of material(s) which form(s) the MTJs is/are indicated with reference numeral 1162, the layer(s) of material(s) which form(s) the top electrodes are indicated with reference numeral 1164.

FIG. 12D further illustrates that the performance of operation 1008 can include the formation of an oxide layer 1166, an OPL layer 1168, and a SiARC layer 1170 on top of the top electrode. In at least some embodiments of the present disclosure, each of the top electrode and the bottom electrode can be formed of, for example, W, WN, Ta, TaN, Ti, TiN, Ru, Mo, Cr, V, Pd, Pt, or Al.

In the embodiments shown in FIG. 12D, the layer(s) of material(s) 1158 which form(s) the selector devices is/are formed between the shared bottom contact 1128 and the layer(s) of material(s) 1160 which form(s) the bottom electrodes of the MRAM cells. This arrangement illustrates one example embodiment of the present disclosure. Alternatively, in embodiments of the present disclosure wherein the selector devices are arranged in locations other than between the shared bottom contact 1128 and the layer(s) of material(s) 1160 which form(s) the bottom electrodes, the layer(s) of material(s) 1158 which form(s) the selector devices is/are formed and arranged in a different order than is illustrated by FIG. 12D.

Returning to FIG. 10, at operation 1012, metal lines are formed which connect the MRAM cells in an array in the memory area of the memory storage device and connect the memory area to the logic area of the memory storage device. The metal lines can include, for example, a first metal line which connects the first top electrode with a first transistor and a second metal line which connects the second top electrode with a second transistor. More specifically, the first metal line can be a first bit line (such as first bit line 120) which connects the first MRAM cell (such as first single-bit MRAM cell 104) with a first transistor (such as first transistor 128) which is located in the logic area 1108 of the memory storage device. Similarly, the second metal line can be a second bit line (such as second bit line 124) which connects the second MRAM cell (such as second single-bit MRAM cell 108) with a second transistor (such as second transistor 132) which is located in the logic area 1108 of the memory storage device 1100.

Figure 12E:
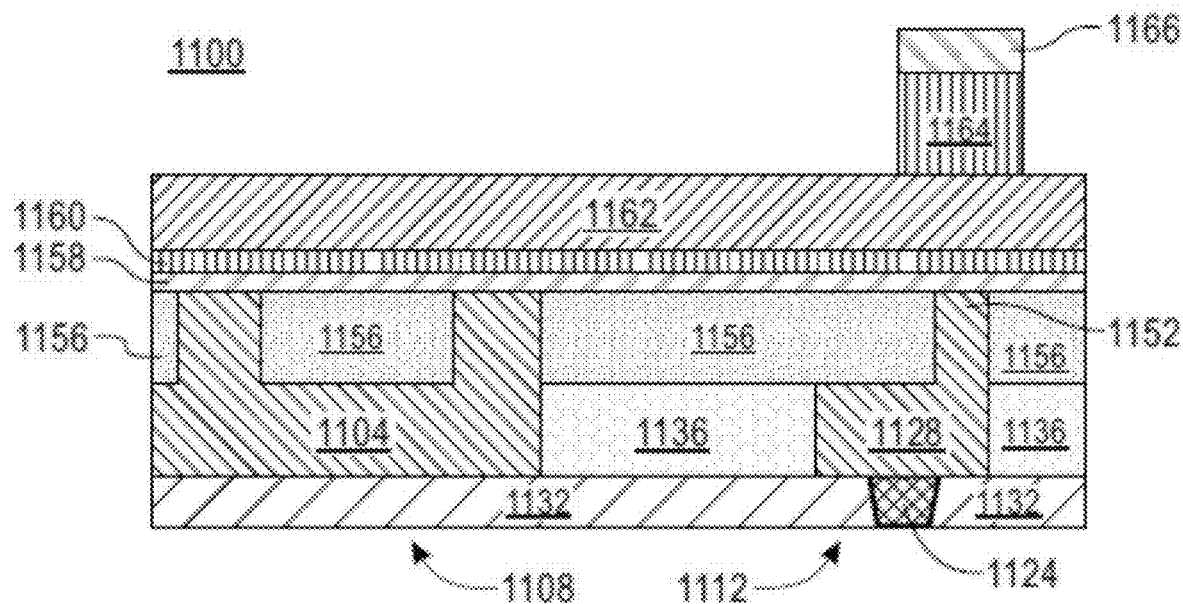
FIG. 12E depicts a schematic side cross-sectional drawing of a two-bit MRAM cell shown in FIG. 12D following the performance of a portion of the method, in accordance with embodiments of the present disclosure.
Figure 12F:
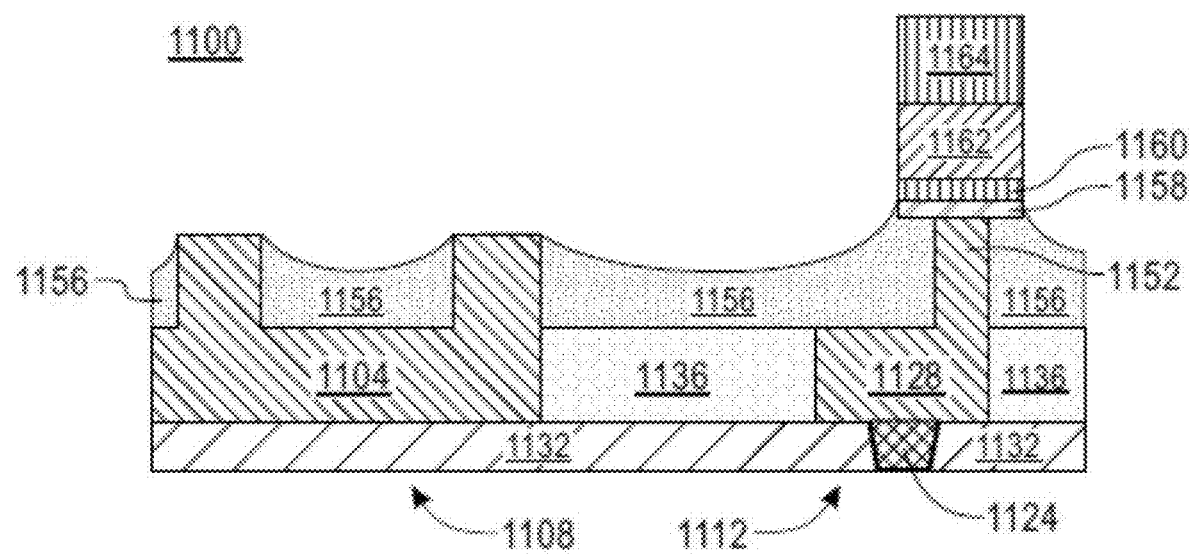
FIG. 12F depicts a schematic side cross-sectional drawing of a two-bit MRAM cell shown in FIG. 12E following the performance of a portion of the method, in accordance with embodiments of the present disclosure.
Figure 12G:
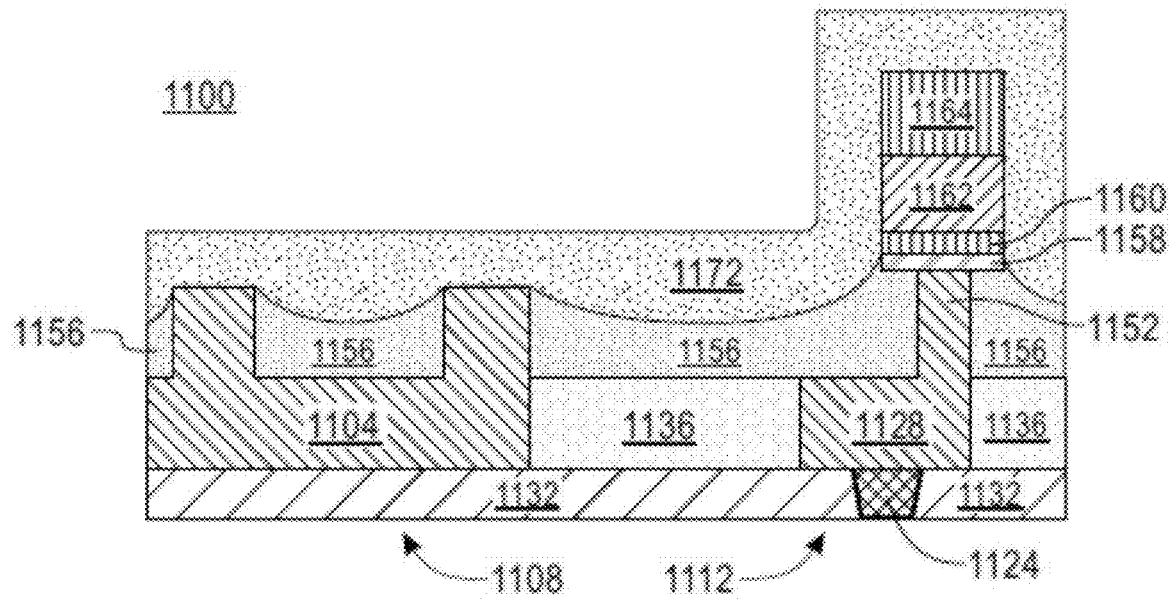
FIG. 12G depicts a schematic side cross-sectional drawing of a two-bit MRAM cell shown in FIG. 12F following the performance of a portion of the method, in accordance with embodiments of the present disclosure.
Figure 12H:
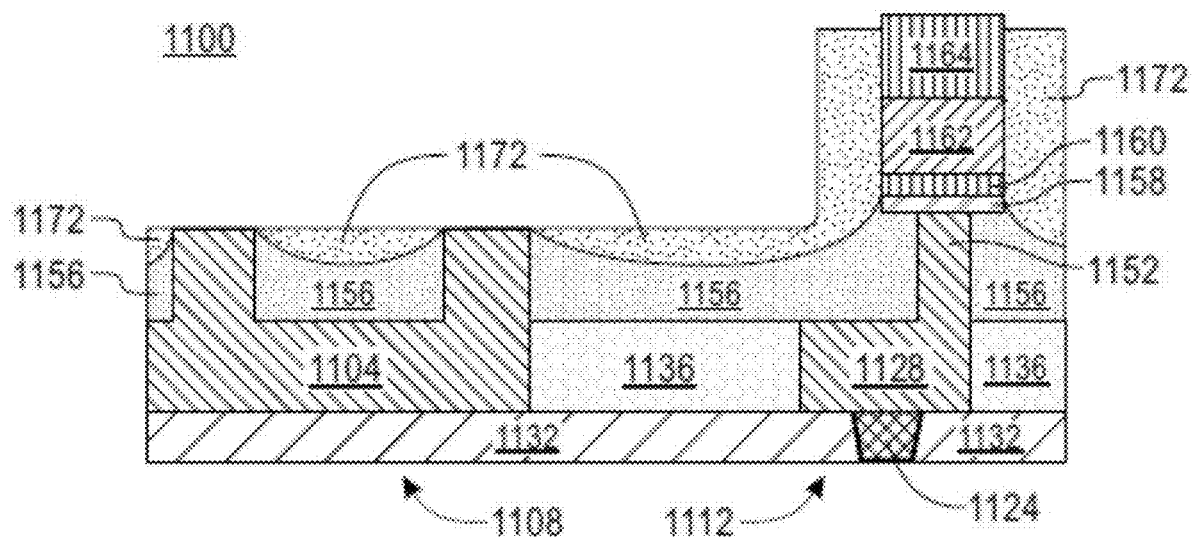
FIG. 12H depicts a schematic side cross-sectional drawing of a two-bit MRAM cell shown in FIG. 12G following the performance of a portion of the method, in accordance with embodiments of the present disclosure.
Figure 12I:
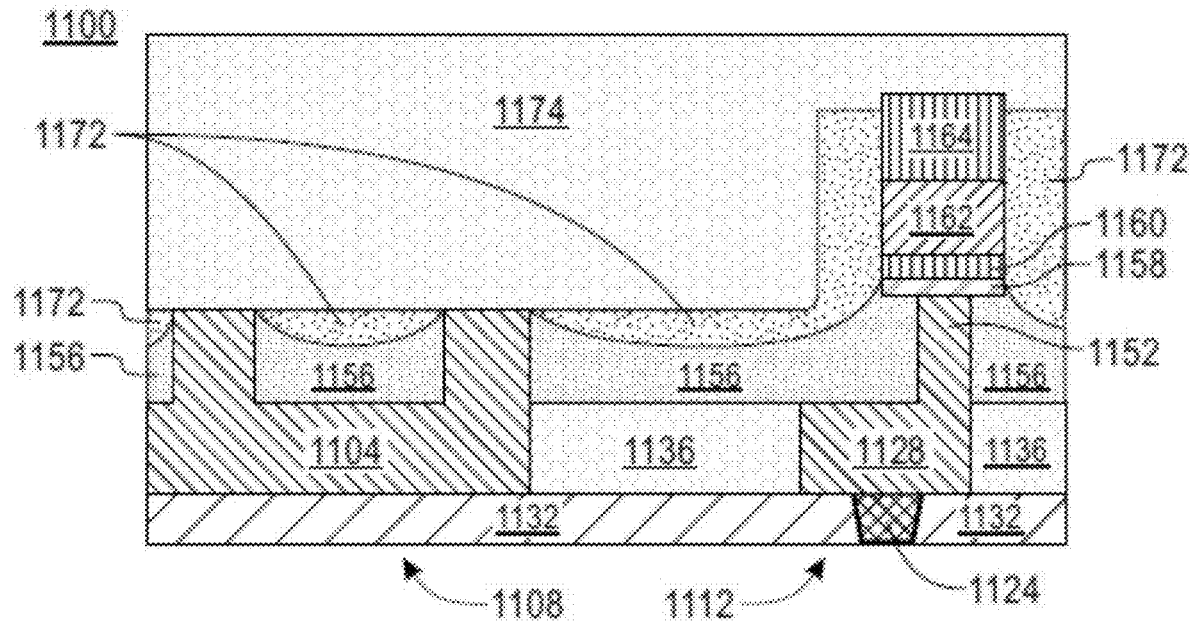
FIG. 12I depicts a schematic side cross-sectional drawing of a two-bit MRAM cell shown in FIG. 12H following the performance of a portion of the method, in accordance with embodiments of the present disclosure.
Figure 12J:
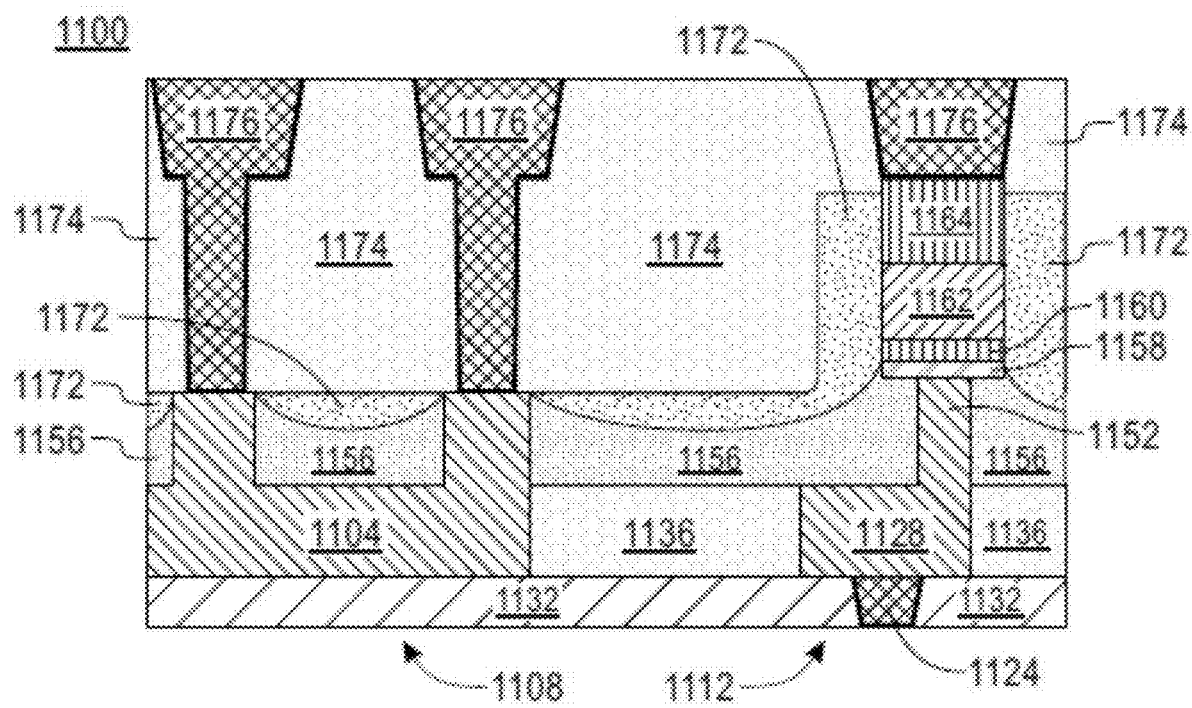
FIG. 12J depicts a schematic side cross-sectional drawing of a two-bit MRAM cell shown in FIG. 12I following the performance of a portion of the method, in accordance with embodiments of the present disclosure.

Fabrication processes for forming the metal lines which connect the MRAM cells are known in the art. In at least some embodiments of the present disclosure, operation 1012 can include performing a top electrode or hardmask etch procedure (the result of which is illustrated by FIG. 12E) using RIE or IBE, performing an IBE procedure (the result of which is illustrated by FIG. 12F), performing a dielectric encapsulation procedure (the result of which is illustrated by FIG. 12G), performing an encapsulation etch back procedure (the result of which is illustrated by FIG. 12H), performing an ILD deposition procedure (the result of which is illustrated by FIG. 12I), and forming the top electrode contacts 1176 (the result of which is illustrated by FIG. 12J).

In at least one embodiment of the present disclosure, the dielectric encapsulation procedure can be performed using a dielectric material 1172 such as, for example, SiN, SiCN(H), or another similar material. Such material is selected on the basis of its ability to provide a good hermetic seal which protects MRAM cells from exposure to ambient oxygen, moisture, and other chemicals from subsequent process steps. In at least one embodiment of the present disclosure, the ILD deposition procedure can be performed using the same material 1174 as for the ILD 1136. In alternative embodiments, a different material can be used. In at least one embodiment of the present disclosure, the top electrode contacts 1176 can be formed by performing a dual damascene procedure.

The procedures listed above provide an example of fabrication processes which may be used to form the metal lines in operation 1012. In alternative embodiments of the present disclosure, the results of the procedures listed above, which are illustrated in FIGS. 12A-12J, can be achieved by the performance of other known procedures.

Figure 13:
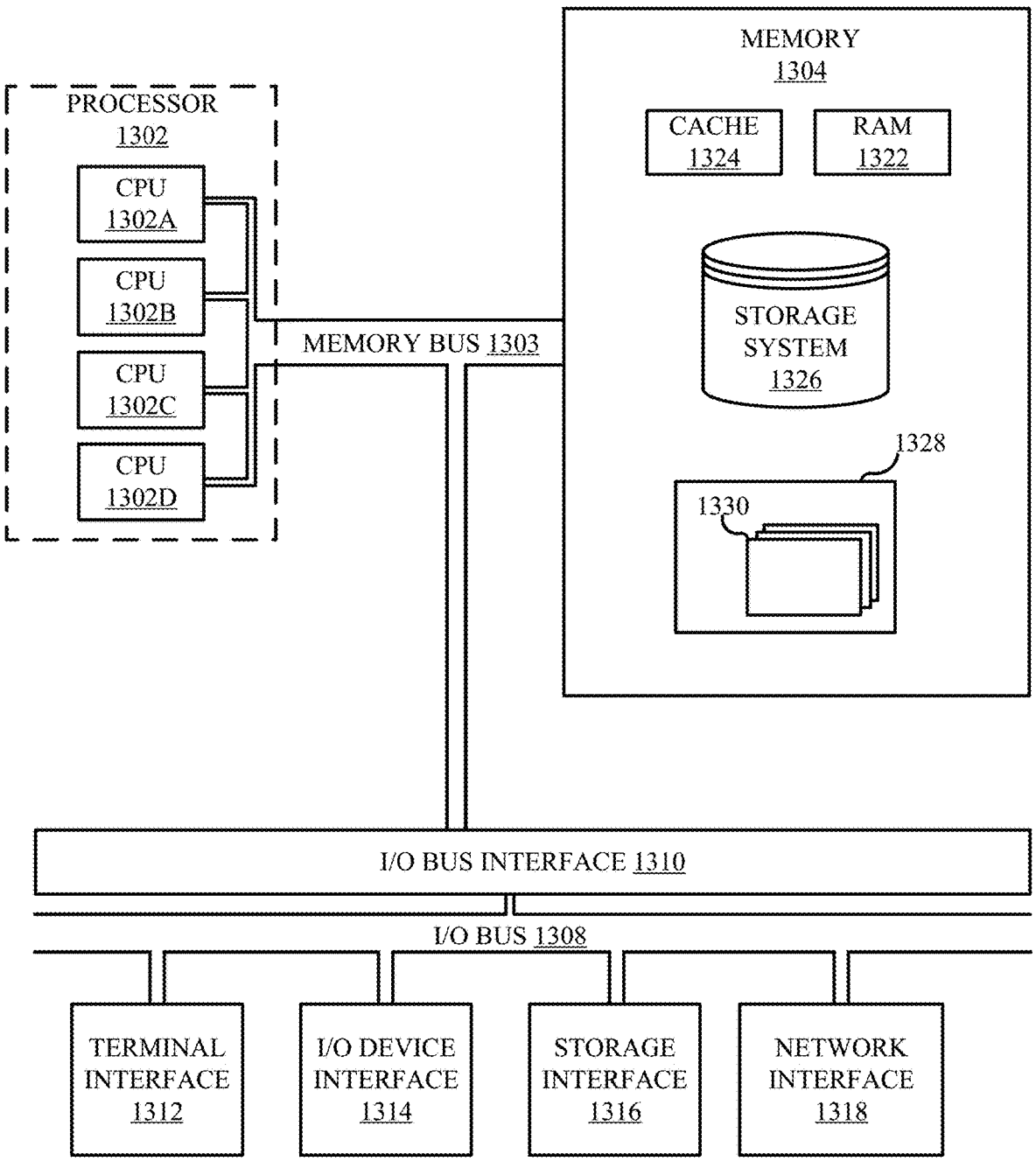
FIG. 13 illustrates a high-level block diagram of an example computer system that may be used in implementing one or more of the methods, tools, and modules, and any related functions, described herein, in accordance with embodiments of the present disclosure.

Referring now to FIG. 13, shown is a high-level block diagram of an example computer system 1301 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 1301 may comprise one or more CPUs 1302, a memory subsystem 1304, a terminal interface 1312, a storage interface 1316, an I/O (Input/Output) device interface 1314, and a network interface 1318, all of which may be communicatively coupled, directly or indirectly, for inter-component communication via a memory bus 1303, an I/O bus 1308, and an I/O bus interface unit 1310.

The computer system 1301 may contain one or more general-purpose programmable central processing units (CPUs) 1302A, 1302B, 1302C, and 1302D, herein generically referred to as the CPU 1302. In some embodiments, the computer system 1301 may contain multiple processors typical of a relatively large system; however, in other embodiments the computer system 1301 may alternatively be a single CPU system. Each CPU 1302 may execute instructions stored in the memory subsystem 1304 and may include one or more levels of on-board cache.

System memory 1304 may include computer system readable media in the form of volatile memory, such as random access memory (RAM) 1322 or cache memory 1324. Computer system 1301 may further include other removable/non-removable, volatile/non-volatile computer system storage media. By way of example only, storage system 1326 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 1304 can include flash memory, e.g., a flash memory stick drive or a flash drive. Memory devices can be connected to memory bus 1303 by one or more data media interfaces. The memory 1304 may include at least one program product having a set (e.g., at least one) of program modules that are configured to carry out the functions of various embodiments.

One or more programs/utilities 1328, each having at least one set of program modules 1330 may be stored in memory 1304. The programs/utilities 1328 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Program modules 1330 generally perform the functions or methodologies of various embodiments.

Although the memory bus 1303 is shown in FIG. 13 as a single bus structure providing a direct communication path among the CPUs 1302, the memory subsystem 1304, and the I/O bus interface 1310, the memory bus 1303 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 1310 and the I/O bus 1308 are shown as single respective units, the computer system 1301 may, in some embodiments, contain multiple I/O bus interface units 1310, multiple I/O buses 1308, or both. Further, while multiple I/O interface units are shown, which separate the I/O bus 1308 from various communications paths running to the various I/O devices, in other embodiments some or all of the I/O devices may be connected directly to one or more system I/O buses.

In some embodiments, the computer system 1301 may be a multi-user mainframe computer system, a single-user system, or a server computer or similar device that has little or no direct user interface, but receives requests from other computer systems (clients). Further, in some embodiments, the computer system 1301 may be implemented as a desktop computer, portable computer, laptop or notebook computer, tablet computer, pocket computer, telephone, smart phone, network switches or routers, or any other appropriate type of electronic device.

It is noted that FIG. 13 is intended to depict the representative major components of an exemplary computer system 1301. In some embodiments, however, individual components may have greater or lesser complexity than as represented in FIG. 13, components other than or in addition to those shown in FIG. 13 may be present, and the number, type, and configuration of such components may vary. Furthermore, the modules are listed and described illustratively according to an embodiment and are not meant to indicate necessity of a particular module or exclusivity of other potential modules (or functions/purposes as applied to a specific module).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications, alterations, and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s). Additionally, it is intended that the following claim(s) be interpreted as covering all such alterations and modifications as fall within the true spirit and scope of the invention.

What is claimed is:

1. A magnetoresistive random-access memory (MRAM) device, the MRAM device comprising:
    a first cell connected to a first bit line;
    a second cell connected to a second bit line;
    a shared transistor connected to the first cell and connected to the second cell;
    a first selector device corresponding to the first cell, the first selector device configured to permit current to flow through the first cell to the shared transistor when voltage applied to the first selector device is larger than a threshold activation voltage;
    a second selector device corresponding to the second cell, the second selector device configured to permit current to flow through the second cell to the shared transistor when voltage applied to the second selector device is larger than the threshold activation voltage; and
    a word line connected to a gate of the shared transistor.
2. The MRAM device of claim 1, wherein:
    the shared transistor is connected to a source line.
3. The MRAM device of claim 2, wherein:
    the first cell is connected to the source line through the shared transistor; and
    the second cell is connected to the source line through the shared transistor.
4. The MRAM device of claim 1, wherein:
    each of the first cell and the second cell includes a corresponding magnetic tunnel junction (MTJ)

arranged between a corresponding top electrode and a corresponding bottom electrode;
each MTJ includes a reference layer, a tunnel barrier layer, and a free layer; and
at least one of the first selector device and the second selector device is arranged between the reference layer and the bottom electrode of the corresponding cell.

5. The MRAM device of claim 1, wherein:
each of the first cell and the second cell includes a corresponding MTJ arranged between a corresponding top electrode and a corresponding bottom electrode;
each MTJ includes a reference layer, a tunnel barrier layer, and a free layer; and
at least one of the first selector device and the second selector device is arranged between the free layer and the top electrode of the corresponding cell.

6. The MRAM device of claim 1, wherein:
each of the first cell and the second cell includes a corresponding MTJ arranged between a corresponding top electrode and a corresponding bottom electrode;
both bottom electrodes are connected to a shared landing pad; and
at least one of the first selector device and the second selector device is arranged between the corresponding bottom electrode and the shared landing pad.

7. The MRAM device of claim 1, wherein:
the threshold activation voltage is less than a read voltage of a read current that is used to determine a value stored by one of the first cell and the second cell.

8. The MRAM device of claim 7, wherein the read voltage is less than three times the threshold activation voltage.

9. The MRAM device of claim 1, wherein:
the threshold activation voltage is less than a write voltage of a write current that is used to store a value in one of the first cell and the second cell.

10. The MRAM device of claim 9, wherein the write voltage is less than three times the threshold activation voltage.

11. The MRAM device of claim 1, wherein:
at least one of the first selector device and the second selector device is a selector diode;
the selector diode is activated in a forward direction by voltage at least as large as a forward activation threshold voltage;
the selector diode is activated in a reverse direction by voltage at least as large as a reverse activation threshold voltage;
the reverse activation threshold voltage is larger than the forward activation threshold voltage; and
the forward activation threshold voltage is less than a read voltage of a read current that is used to determine a value stored by one of the first cell and the second cell.

12. The MRAM device of claim 11, wherein the read voltage is less than the sum of the reverse activation threshold voltage and two times the forward activation threshold voltage.

13. The MRAM device of claim 1, wherein:
at least one of the first selector device and the second selector device is a selector diode;
the selector diode is activated in a forward direction by voltage at least as large as a forward activation threshold voltage;
the selector diode is activated in a reverse direction by voltage at least as large as a reverse activation threshold voltage;
the reverse activation threshold voltage is larger than the forward activation threshold voltage; and
the forward activation threshold voltage is less than a write voltage of a write current that is used to store a value in one of the first cell and the second cell.

14. The MRAM device of claim 13, wherein the write voltage is less than the sum of the reverse activation threshold voltage and two times the forward activation threshold voltage.

15. A method of forming a two-bit MRAM device, the method comprising:
forming a first bottom electrode and a second bottom electrode on a common landing pad;
forming a first cell connected to the first bottom electrode, wherein forming the first cell includes forming a first top electrode and a first selector device such that the first selector device is arranged between the first top electrode and the common landing pad; and
forming a second cell connected to the second bottom electrode, wherein forming the second cell includes forming a second top electrode and a second selector device such that the second selector device is arranged between the second top electrode and the common landing pad.

16. The method of claim 15, wherein:
forming the first selector device and the second selector device includes patterning a selector device material using an etch procedure.

17. The method of claim 16, wherein:
the selector device material includes at least one selected from the group consisting of: SiOx, TiOx, AlOx, WOx, TiNOx, HfOx, TaOx, and NbOx.

18. The method of claim 15, the method further comprising:
forming a first metal line connecting the first top electrode with a first transistor; and
forming a second metal line connecting the second top electrode with a second transistor, wherein the first metal line is separate from the second metal line.

19. The method of claim 18, wherein forming the first metal line and forming the second metal line includes performing a damascene procedure.

20. A method of programming a two-bit MRAM device, the method comprising:
receiving a write command to program a first bit in the two-bit MRAM device, the two-bit MRAM device comprising:
a first cell including a first MTJ and a first electrode;
a second cell including a second MTJ and a second electrode;
a first transistor connected to the first cell and to a first bit line;
a second transistor connected to the second cell and to a second bit line;
a shared transistor connecting the first cell and the second cell to a source line;
a first selector device arranged between the shared transistor and the first electrode; and
a second selector device arranged between the shared transistor and the second electrode;
determining that the first bit is to be stored in a particular MTJ, wherein the particular MTJ is one of the first MTJ and the second MTJ; and
selectively activating the shared transistor and one of the first transistor and the second transistor to cause current to flow through the particular MTJ, wherein selectively activating the shared transistor and the one of the first transistor and the second transistor causes current to flow through the first selector device when the particular MTJ is the first MTJ and through the second selector device when the particular MTJ is the second MTJ.

21. The method of claim 20, wherein:
the particular MTJ is the first MTJ;
selectively activating the shared transistor and one of the first transistor and the second transistor includes activating the shared transistor and the first transistor to cause current to flow through the first MTJ; and
the second transistor is not activated.

22. The method of claim 21, wherein:
current does not flow through the second selector device.

23. The method of claim 20, wherein:
the particular MTJ is the second MTJ;
selectively activating the shared transistor and one of the first transistor and the second transistor includes activating the shared transistor and the second transistor to cause current to flow through the second MTJ; and
the first transistor is not activated.

24. A method of determining a value stored in a two-bit MRAM device, the method comprising:
receiving a read command to determine a value stored in a first bit in the two-bit MRAM device, the two-bit MRAM device comprising:
a first cell including a first MTJ and a first electrode;
a second cell including a second MTJ and a second electrode;
a first transistor connected to the first cell and to a first bit line;
a second transistor connected to the second cell and to a second bit line;
a shared transistor connecting the first cell and the second cell to a source line;
a first selector device arranged between the shared transistor and the first electrode; and
a second selector device arranged between the shared transistor and the second electrode;
determining that the first bit for which the stored value is to be determined is in a particular MTJ, wherein the particular MTJ is one of the first MTJ and the second MTJ; and
selectively activating the shared transistor and one of the first transistor and the second transistor to cause current to flow through the particular MTJ, wherein selectively activating the shared transistor and the one of the first transistor and the second transistor causes current to flow through the first selector device when the particular MTJ is the first MTJ and through the second selector device when the particular MTJ is the second MTJ.

25. A method of forming a two-bit MRAM device, the method comprising:
connecting a first single-bit MRAM cell to a first bit line and to a source line, wherein the first bit line is selectively operated by a first transistor, wherein the first single-bit MRAM cell is connected to the source line through a second transistor, and wherein the first single-bit MRAM cell is connected to the second transistor through a first selector switch device;
connecting a second single-bit MRAM cell to a second bit line and to the source line, wherein the second bit line is selectively operated by a third transistor, wherein the second single-bit MRAM cell is connected to the source line through the second transistor, and wherein the second single-bit MRAM cell is connected to the second transistor through a second selector switch device, wherein:
each of the first single-bit MRAM cell and the second single-bit MRAM cell is programmable by passing a current having a voltage at least as large as a write threshold voltage therethrough,
each of the first selector switch device and the second selector switch device is configured to connect a respective MRAM cell to the second transistor when activated by a voltage at least as large as an activation threshold voltage,
the write threshold voltage is larger than the activation threshold voltage, and
the write threshold voltage is smaller than three times the activation threshold voltage.

* * * * *